United States Patent
Nikata et al.

(10) Patent No.: US 11,952,522 B2
(45) Date of Patent: Apr. 9, 2024

(54) QUANTUM DOT AND MANUFACTURING METHOD FOR THE SAME

(71) Applicant: NS Materials Inc., Fukuoka (JP)

(72) Inventors: Soichiro Nikata, Fukuoka (JP); Yuko Ogura, Fukuoka (JP); Mikihiro Takasaki, Fukuoka (JP); Yuka Takamizuma, Fukuoka (JP)

(73) Assignee: NS MATERIALS INC., Fukuoka (JP)

(*) Notice: Subject to any disclaimer, the term of this patent is extended or adjusted under 35 U.S.C. 154(b) by 301 days.

(21) Appl. No.: 17/257,101

(22) PCT Filed: Sep. 16, 2020

(86) PCT No.: PCT/JP2020/035058
§ 371 (c)(1),
(2) Date: Dec. 30, 2020

(87) PCT Pub. No.: WO2021/054355
PCT Pub. Date: Mar. 25, 2021

(65) Prior Publication Data
US 2021/0371744 A1 Dec. 2, 2021

(30) Foreign Application Priority Data

Sep. 20, 2019 (JP) ................................. 2019-170996
Feb. 17, 2020 (JP) ................................. 2020-024688

(51) Int. Cl.
C09K 11/88 (2006.01)
B82Y 20/00 (2011.01)
B82Y 40/00 (2011.01)
C01B 19/04 (2006.01)

(52) U.S. Cl.
CPC ............ *C09K 11/883* (2013.01); *C01B 19/04* (2013.01); *C09K 11/88* (2013.01); *B82Y 20/00* (2013.01); *B82Y 40/00* (2013.01); *C01P 2004/64* (2013.01); *C01P 2006/60* (2013.01)

(58) Field of Classification Search
CPC ....... C09K 11/88; C09K 11/883; C01B 19/04; B82Y 20/00; B82Y 40/00
See application file for complete search history.

(56) References Cited

U.S. PATENT DOCUMENTS

2009/0159849 A1 6/2009 Uehara et al.
2017/0066965 A1* 3/2017 Truskier ............... C09K 11/883
2019/0257003 A1 8/2019 Kim et al.
2019/0280231 A1 9/2019 Kim et al.
2020/0212256 A1* 7/2020 Iida ........................ B82Y 40/00
2020/0347296 A1* 11/2020 Ogura ................... C09K 11/025
2023/0080877 A1* 3/2023 Yamamoto ........... H10K 50/115
257/40

FOREIGN PATENT DOCUMENTS

| CN | 108795412 | * | 11/2018 |
| WO | 2007/060889 | | 5/2007 |
| WO | 2019/022217 | | 1/2019 |
| WO | WO 2019/022217 | * | 1/2019 |
| WO | 2019/074083 | | 4/2019 |
| WO | WO 2019/074083 | * | 4/2019 |
| WO | WO 2021/166054 | * | 8/2021 |

OTHER PUBLICATIONS

Translation for CN 108795412, Jan. 13, 2018.*
Ippen et al, "ZnSe/ZnS quantum dots as emitting material in blue QD-LEDs with narrow emission peak and wavelngth tunability". Organic Electronics, 15, (2014), 126-131, Nov. 15, 2013.*
Lesnyak et al, "Cu Vacancies Boost Cation Exchange Reactions in Copper Selenide Nanocrystals", J. Am. Chem. Soc., 2015, 137, 9315-9323, Jul. 3, 2015.*
Ippen et al., "ZnSe/ZnS quantum dots as emitting material in blue QD-LEDs with narrow emission peak and wavelength tunability" Organic Electronics 15, 2014, pp. 126-131.
Mirnajafizadeh et al., "Hydrothermal synthesis of hightly luminescent blue-emitting ZnSe(S) quantum dots exhibiting low toxicity", Materials Science and Engineering C 64, 2016, pp. 167-172.
Lesnyak et al., "Cu Vacancies Boost Cation Exchange Reactions in Copper Selenide Nanocrystals", J. Am. Chem. Soc., 2015, 137 pp. 9315-9323.
ISR issued in WIPO Patent Application No. PCT/JP2020/035058, dated Dec. 1, 2020, English translation.
EESR issued in EP Patent Application No. 208244079, Sep. 1, 2023.

* cited by examiner

*Primary Examiner* — C Melissa Koslow
(74) *Attorney, Agent, or Firm* — GREENBLUM & BERNSTEIN P.L.C.

(57) ABSTRACT

An object is to provide a quantum dot that has a narrow fluorescence half-width and a high fluorescence quantum yield, and emits blue fluorescence. A quantum dot (5) according to the present invention includes at least Zn and Se and does not include Cd, and has a particle diameter of 5 nm or more and 20 nm or less. In addition, the quantum dot (5) according to the present invention includes at least Zn and Se and does not include Cd, and has a fluorescence quantum yield of 5% or more and a fluorescence half-width of 25 nm or less. In the present invention, the fluorescence lifetime can be made 50 ns or less.

6 Claims, 13 Drawing Sheets

QUANTUM DOT AND MANUFACTURING METHOD FOR THE SAME

TECHNICAL FIELD

The present invention relates to a quantum dot that does not include cadmium, and a manufacturing method for the quantum dot.

BACKGROUND ART

A quantum dot is referred to as a fluorescent nanoparticle because the quantum dot emits fluorescence and has a nanometer-level size. The quantum dot is also referred to as a semiconductor nanoparticle because a composition of the quantum dot is derived from a semiconductor material. The quantum dot is moreover referred to as a nanocrystal because a structure of the quantum dot includes a particular crystal structure.

The performance of the quantum dot is expressed by, for example, a fluorescence quantum yield (Quantum Yield: QY) or a fluorescence half-width (Full Width at Half Maximum: FWHM). When the quantum dot is used as a wavelength conversion material for a visible light region, the most characteristic point is that the wide range of colors can be expressed, that is, the color gamut is wide. In order to achieve the wider color gamut using the quantum dot, it is important to narrow the fluorescence half-width.

In the application for a display using quantum dots, in the case of employing photoluminescence (PL) as the light-emitting principle, excitation light is generated using a blue LED as a backlight and this light is converted into green light and red light using the quantum dots. On the other hand, for example, in the case where electroluminescence (EL) is employed as the light-emitting principle, or in the case where the light of all the three primary colors is emitted from quantum dots by another method, a quantum dot that emits blue light is required. At this time, in order to achieve the wider color gamut, not only green and red but also blue light needs to have the narrow half-width. Therefore, in the case where the light of all the three RGB colors is emitted from the quantum dots, it is necessary that the fluorescence half-width of the quantum dot that emits blue light is narrow.

One typical example of the blue quantum dots is a cadmium selenide (CdSe)-based quantum dot including cadmium (Cd). Cd is, however, regulated internationally and it has been difficult to put the material including CdSe quantum dots into practical application.

On the other hand, the development of Cd-free quantum dots has also been examined. For example, the development of chalcopyrite-based quantum dots such as $CuInS_2$ and $AgInS_2$ and indium phosphide (InP)-based quantum dots has been advanced (for example, see Patent Literature 1). However, the currently developed quantum dots generally have the wide fluorescence half-width and are not suitable as the quantum dots that emit the blue light.

Non-Patent Literature 1 below specifically describes a method of directly synthesizing ZnSe using diphenylphosphine selenide, which is considered to be relatively highly reactive with an organic zinc compound; however, this method is not suitable for the quantum dots that emit the blue light.

Moreover, Non-Patent Literature 2 below reports a method of synthesizing ZnSe in an aqueous system. Although the reaction progresses at low temperature, the fluorescence half-width is 30 nm or more, which is a little wide, and the fluorescence wavelength is less than 430 nm; thus, this method is not suitable as an alternative to the conventional blue LED to achieve the wider color gamut.

Additionally, Non-Patent Literature 3 below reports a method of synthesizing a ZnSe-based quantum dot by forming a precursor of copper selenide (CuSe) or the like and then exchanging cations between copper and zinc (Zn). However, it is understood that the particle of the copper selenide, which is the precursor, is as large as 15 nm and the reaction condition at the cation exchange between copper and zinc is not optimal and therefore, copper remains in the ZnSe-based quantum dot after the cation exchange. The examination result in the present invention indicates that the ZnSe-based quantum dot in which cupper remains cannot emit light. Alternatively, if the copper remains, even though light is emitted, this light comes from a defect, and in the light emission, the half-width of the light emission spectrum is 30 nm or more. This remaining of copper is also influenced by the particle size of the copper selenide, which is the precursor, and in the case where the particle is large, the copper tends to remain even after the cation exchange. Even if ZnSe is identified with XRD, light emission often fails because a very small amount of copper remains. Therefore, in the example according to Non-Patent Literature 3, the copper remains because the particle size of this precursor is not controlled and the cation exchange method is not optimized. Accordingly, the blue fluorescence has not been reported. Thus, although there are many reports about the cation exchange methods, the intensive light emission has not been reported yet because of the aforementioned reasons.

CITATION LIST

Patent Literature

[Patent Literature 1] International Publication No. WO 2007/060889

Non-Patent Literatures

[Non-Patent Literature 1] Organic Electronics 15 (2014) 126-131
[Non-Patent Literature 2] Materials Science and Engineering C 64 (2016) 167-172
[Non-Patent Literature 3] J. Am. Chem. Soc. (2015) 137 29 9315-9323

SUMMARY OF INVENTION

Technical Problem

The research and development of the blue quantum dots have been advanced as described above; however, none of these quantum dots have achieved the performance high enough to replace the Cd-based quantum dots from the viewpoints of the fluorescence half-width and the fluorescence quantum yield at the level where the mass production is possible.

The present invention has been made in view of the above circumstances, and an object is to provide a quantum dot that has a narrow fluorescence half-width and a high fluorescence quantum yield, and emits blue fluorescence.

It is another object of the present invention to provide a quantum dot with a core-shell structure that emits the blue fluorescence and has the high luminous efficiency and the narrow fluorescence half-width.

It is still another object of the present invention to provide a manufacturing method for a quantum dot that can synthesize the aforementioned quantum dot safely in a manner that mass production is possible.

Solution to Problem

A quantum dot according to one aspect of the present invention includes at least Zn and Se and does not include Cd, and has a particle diameter of 5 nm or more and 20 nm or less.

A quantum dot according to another aspect of the present invention includes at least Zn and Se and does not include Cd, and has a fluorescence quantum yield of 5% or more and a fluorescence half-width of 25 nm or less. In the present invention, it is preferable that the quantum dot has a fluorescence lifetime of 50 ns or less.

In the present invention, the quantum dot may have a core-shell structure including Zn, Se, and S. In this structure, it is preferable that a maximum intensity peak position in XRD is on a 0.050 to 1.2° higher angle side than a crystal peak of a ZnSe core alone.

In the present invention, it is preferable that the quantum dot has a fluorescence wavelength of 410 nm or more and 490 nm or less. In the present invention, it is preferable that the quantum dot has a surface covered with a ligand. In the present invention, it is preferable that the ligand is at least one selected from aliphatic amine-based ligands, phosphine-based ligands, and aliphatic carboxylic acid-based ligands.

A manufacturing method for a quantum dot according to the present invention includes synthesizing a copper chalcogenide precursor from an organic copper compound or an inorganic copper compound, and an organic chalcogen compound, and synthesizing a quantum dot including at least Zn and Se and not including Cd by using the copper chalcogenide precursor.

In the present invention, it is preferable that Cu and Zn of the copper chalcogenide precursor are metal-exchanged. In the present invention, it is preferable that the metal exchange reaction is performed at 150° C. or more and 300° C. or less. In the present invention, it is preferable that the copper chalcogenide precursor is synthesized at a reaction temperature of 140° C. or more and 250° C. or less. In the present invention, it is preferable that the quantum dot is a nanocrystal including Zn and Se, or Zn and Se and S.

Advantageous Effects of Invention

By the quantum dot according to the present invention, the quantum dots with the uniform particle shape and size can be synthesized and thus, the fluorescence half-width can be narrowed and the wider color gamut can be achieved.

In addition, by the manufacturing method for a quantum dot according to the present invention, the quantum dot having the narrow fluorescence half-width and not including Cd can be manufactured safely in a method capable of mass production.

DESCRIPTION OF EMBODIMENT

One embodiment of the present invention (hereinafter abbreviated as "embodiment") is hereinafter described in detail. Note that the present invention is not limited to the embodiment below, and various modifications are possible within the range of the concept thereof.

Figure 1A:
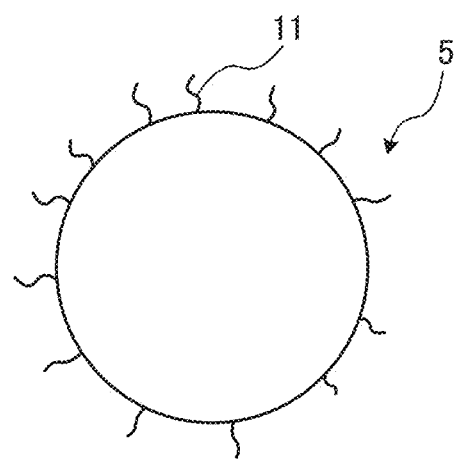
FIG. 1A is a schematic diagram of a quantum dot according to an embodiment of the present invention.
Figure 1B:
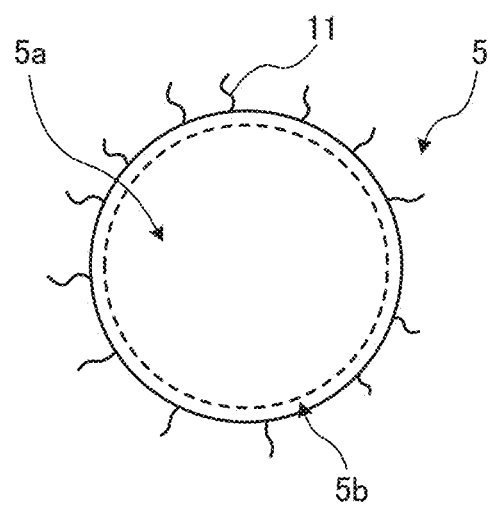
FIG. 1B is a schematic diagram of a quantum dot according to the embodiment of the present invention.

FIG. 1A and FIG. 1B are schematic diagrams of a quantum dot in the present embodiment. A quantum dot 5 illustrated in FIG. 1A is a nanocrystal that does not include cadmium (Cd).

In the present embodiment, the quantum dot 5 includes at least zinc (Zn) and selenium (Se) and does not include Cd. Specifically, the quantum dot is preferably a nanocrystal including Zn and Se, Zn and Se and sulfur (S), or Zn and Se and tellurium (Te).

The quantum dot 5 has a fluorescence characteristic by band edge light emission, and since the particle of the quantum dot 5 has a nanometer-level size, the quantum size effect is exhibited.

Here, the term "nanocrystal" means a nanoparticle with a particle diameter of about several nanometers to several tens of nanometers. In the present embodiment, a number of quantum dots 5 can be generated so that the quantum dots 5 have substantially uniform particle diameter.

Zn and Se, Zn and Se and S, or Zn and Se and Te are main components of the quantum dot 5; however, other elements may be included. However, it is preferable that Cd is not included and phosphorus (P) is not included either. An organic phosphorus compound is expensive, and since the organic phosphorus compound is easily oxidized in air, the synthesis is instable. As a result, the cost increases, the fluorescence characteristic becomes instable, and the manufacturing process becomes complicated.

The quantum dot 5 according to the present embodiment has a fluorescence half-width of 25 nm or less. The term "fluorescence half-width" indicates the full-width at half maximum expressing the spread of the fluorescence wavelength at the half intensity of the peak value of the fluorescence intensity in the fluorescence spectrum. In addition, the fluorescence half-width is preferably 23 nm or less, more preferably 20 nm or less, and much more preferably 15 nm or less. Since the fluorescence half-width can be narrowed in the present embodiment, the wider color gamut can be achieved.

As a reaction system for synthesizing the quantum dot 5 in the present embodiment, after copper chalcogenide is synthesized as a precursor, the precursor is subjected to metal exchange reaction, which will be described below. By manufacturing the quantum dot 5 on the basis of such an indirect synthesis reaction, the fluorescence half-width can be narrowed and specifically, a fluorescence half-width of 25 nm or less can be achieved.

On a surface of the quantum dot 5, a number of organic ligands 11 are preferably coordinated. Thus, the aggregation of the quantum dots 5 can be suppressed and the intended optical characteristic can be achieved. In addition, by adding an amine or thiol ligand, the stability of the light-emitting characteristic of the quantum dot can be improved largely. The ligand that can be used in the reaction is not limited to a particular kind, and for example, the following ligands are typically used.

(1) Aliphatic Primary Amines

Oleylamine: $C_{18}H_{35}NH_2$, stearyl (octadecyl)amine: $C_{18}H_{37}NH_2$, dodecyl (lauryl) amine: $C_{12}H_{25}NH_2$, decylamine: $C_{10}H_{21}NH_2$, and octylamine: $C_8H_{17}NH_2$.

(2) Fatty Acids

Oleic acid: $C_{17}H_{33}COOH$, stearic acid: $C_{17}H_{35}COOH$, palmitic acid: $C_{15}H_{31}COOH$, myristic acid: $C_{13}H_{27}COOH$, lauryl(dodecane)acid: $C_{11}H_{23}COOH$, decanoic acid: $C_9H_{19}COOH$, and octanoic acid: $C_7H_{15}COOH$.

(3) Thiols

Octadecanethiol: $C_{18}H_{37}SH$, hexanedecanethiol: $C_{16}H_{33}SH$, tetradecanethiol: $C_{14}H_{29}SH$, dodecanethiol: $C_{12}H_{25}SH$, decanethiol: $C_1H_{21}SH$, and octanethiol: $C_8H_{17}SH$.

(4) Phosphines

Trioctylphosphine: $(C_8H_{17})_3P$, triphenylphosphine: $(C_6H_5)_3P$, and tributylphosphine: $(C_4H_9)_3P$.

(5) Phosphine Oxides

Trioctylphosphine oxide: $(C_8H_{17})_3P=O$, triphenylphosphine oxide: $(C_6H_5)_3P=O$, and tributylphosphine oxide: $(C_4H_9)_3P=O$.

In the present embodiment, the quantum dot 5 has a fluorescence quantum yield of 5% or more. The fluorescence quantum yield is preferably 20% or more, more preferably 50% or more, and much more preferably 80% or more. In this manner, in the present embodiment, the fluorescence quantum yield of the quantum dot can be increased.

In the present embodiment, the particle diameter of the quantum dot 5 can be adjusted in the range of 5 nm or more and 20 nm or less. In the present embodiment, the particle diameter of the quantum dot 5 can be made preferably 15 nm or less, and more preferably 10 nm or less. Thus, in the present embodiment, the particle diameter of the quantum dot 5 can be decreased and moreover, the variation in particle diameter of the quantum dots 5 can be suppressed; therefore, the quantum dots 5 with the uniform size can be obtained. Accordingly, in the present embodiment, the fluorescence half-width of the quantum dot 5 can be narrowed to be 25 nm or less as described above, and the wider color gamut can be achieved.

In addition, in the present embodiment, the fluorescence lifetime of the quantum dot 5 can be made 50 ns or less. In the present embodiment, furthermore, the fluorescence lifetime can be adjusted to be 40 ns or less, and moreover 30 ns or less. In the present embodiment, the fluorescence lifetime can be shortened but can be even extended to about 50 ns, and thus, the fluorescence lifetime can be adjusted in accordance with the intended purpose.

In the present embodiment, the fluorescence wavelength can be freely controlled to be about 410 nm or more and 490 nm or less. The quantum dot 5 in the present embodiment includes a chalcogen element in addition to Zn, and specifically is a solid solution mainly containing ZnSe. In the present embodiment, the fluorescence wavelength can be controlled by adjusting the particle diameter of the quantum dot 5 and the composition of the quantum dot 5. In the present embodiment, the fluorescence wavelength can be made preferably 430 nm or more, and more preferably 450 nm or more. The quantum dot 5 mainly containing ZnSeTe can have a fluorescence wavelength of 450 nm or more and 490 nm or less. The fluorescence wavelength can be made 480 nm or less, or 470 nm or less.

Thus, the fluorescence wavelength of the quantum dot 5 in the present embodiment can be controlled to be blue.

The quantum dot 5 in FIG. 1B has a core-shell structure including a core 5a and a shell 5b that covers a surface of the core 5a. As illustrated in FIG. 1B, it is preferable that a number of organic ligands 2 are coordinated on the surface of the quantum dot 5.

In the present embodiment, the aforementioned fluorescence half-width and fluorescence quantum yield can be obtained even in the core-shell structure. That is to say, the quantum dot 5 with the core-shell structure illustrated in FIG. 1B can have a fluorescence half-width of 25 nm or less and a fluorescence quantum yield of 5% or more. The preferable ranges of the fluorescence half-width and the fluorescence quantum yield may be the aforementioned ranges.

The particle diameter of the quantum dot 5 with the core-shell structure illustrated in FIG. 1B is 5 nm or more and 20 nm or less. By using the core-shell structure instead of the core alone structure illustrated in FIG. 1A, the particle diameter becomes a little large but a particle diameter of 20 nm or less can be maintained, and the quantum dots 5 having the core-shell structure with the particle diameters kept uniformly very small can be obtained.

The core 5a in the quantum dot 5 illustrated in FIG. 1B is the nanocrystal illustrated in FIG. 1A. Therefore, the core 5a is preferably formed of ZnSe, ZnSeS, or ZnSeTe. The shell 5b does not include Cd, which is similar to the core 5a. The material of the shell 5b is not limited to a particular kind; for example, ZnS is used.

Note that the shell 5b may exist as a solid solution on the surface of the core 5a. In FIG. 1B, the border between the core 5a and the shell 5b is shown by a dotted line, and this means that the border between the core 5a and the shell 5b may be either recognizable or not by the analysis. In the present embodiment, the fluorescence is emitted even from the core 5a alone.

The fluorescence wavelength of the quantum dot 5 with the core-shell structure illustrated in FIG. 1B can be controlled freely to be in the range of about 410 nm or more and 490 nm or less, which is similar to FIG. 1A. In the present embodiment, the fluorescence wavelength can be controlled to be blue. The quantum dot 5 with the core-shell structure can have a fluorescence lifetime of 50 ns, and when the core-shell structure is used, the fluorescence lifetime can be shortened compared to when the core 5a with the same composition and particle diameter is used alone.

Subsequently, a manufacturing method for the quantum dot 5 according to the present embodiment is described. In the present embodiment, first, a copper chalcogenide precursor is synthesized from an organic copper compound or an inorganic copper compound, and an organic chalcogen compound. Specifically, the copper chalcogenide precursor is preferably $Cu_2Se$, $Cu_2SeS$, $Cu_2SeTe$, $Cu_2SeTeS$, CuSe, CuSeS, CuSeTe, or CuSeTeS.

Here, in the present embodiment, the Cu material is not limited to a particular kind, and for example, the following organic copper reagent or inorganic copper reagent can be used. That is to say, cupper (I) acetate: Cu(OAc) and copper (II) acetate: $Cu(OAc)_2$ can be used as the acetate, and copper stearate: $Cu(OC(=O)C_{17}H_{35})_2$, copper oleate: $Cu(OC(=O)C_{17}H_{33})_2$, copper myristate: $Cu(OC(=O)C_{13}H_{27})_2$, copper dodecanoate: $Cu(OC(=O)C_{11}H_{23})_2$, and copper acetylacetonate: $Cu(acac)_2$ can be used as the fatty acid salt. As the halide, both monovalent and divalent compounds are usable; for example, copper (I) chloride: CuCl, copper (II) chloride: $CuCl_2$, copper (I) bromide: CuBr, copper (II) bromide: $CuBr_2$, copper (I) iodide: CuI, and copper (II) iodide: $CuI_2$ can be used.

In the present embodiment, the Se material is obtained using an organic selenium compound (organic chalcogenide) as the material. The structure of the compound is not limited to a particular structure, and for example, trioctylphosphine selenide: $(C_8H_{17})_3P=Se$ in which Se is dissolved in trioctylphosphine, tributylphosphine selenide: $(C_4H_9)_3P=Se$ in which Se is dissolved in tributylphosphine, or the like can be used. A solution (Se-ODE) in which Se is dissolved at high temperature in a high-boiling-point solvent that is hydrocarbon with a long chain, such as octadecene, a solution (Se-DDT/OLAm) in which Se is dissolved in a mixture of oleylamine and dodecanethiol, or the like can be used.

In the present embodiment, Te is obtained using an organic tellurium compound (organic chalcogen compound) as a material. The structure of the compound is not limited to a particular structure, and for example, trioctylphosphine telluride: $(C_8H_{17})_3P=Te$ in which Te is dissolved in trioctylphosphine, tributylphosphine telluride: $(C_4H_9)_3P=Te$ in which Te is dissolved in tributylphosphine, or the like can be used. Furthermore, dialkylditelluride: $R_2Te_2$, such as diphenylditelluride: $(C_6H_5)_2Te_2$, a solution (Te-DDT/OLAm) in which Te is dissolved in a mixture of oleylamine and dodecanethiol, or the like can be used.

In the present embodiment, an organic copper compound or an inorganic copper compound, and an organic chalcogen compound are mixed and dissolved. As the solvent, a saturated hydrocarbon with a high boiling point or octadecene, which is an unsaturated hydrocarbon, can be used. Besides this, t-butylbenzene can be used as an aromatic solvent with a high boiling point, and butyl butyrate: $C_4H_9COOC_4H_9$, benzyl butyrate: $C_6H_5CH_2COOC_4H_9$, or the like can be used as an ester solvent with a high boiling point. As the solvent, an aliphatic amine compound, a fatty acid compound, an aliphatic phosphorus compound, or a mixture of these can be used.

At this time, the reaction temperature is set in the range of 140° C. or more and 250° C. or less to synthesize the copper chalcogenide precursor. The reaction temperature is preferably lower temperature, which is 140° C. or more and 220° C. or less, and more preferably much lower temperature, which is 140° C. or more and 200° C. or less.

In the present embodiment, although the reaction method is not limited to a particular method, it is important to synthesize $Cu_2Se$, $Cu_2SeS$, $Cu_2SeTe$, and $Cu_2SeTeS$ having the uniform particle diameter in order to obtain the quantum dot having the narrow fluorescence half-width.

The particle diameter of the copper chalcogenide precursor such as $Cu_2Se$, $Cu_2SeS$, $Cu_2SeTe$, or $Cu_2SeTeS$ is preferably 20 nm or less, more preferably 15 nm or less, and much more preferably 10 nm or less. With the composition and the particle diameter of the copper chalcogenide precursor, the wavelength of the ZnSe-based quantum dot can be controlled. Thus, it is important to control the particle diameter as appropriate.

Furthermore, in the present embodiment, in order to obtain the quantum dot having a narrower fluorescence half-width as the core, it is important to dissolve S in the core. Therefore, it is preferable to add thiol in the synthesis of $Cu_2Se$ or $Cu_2SeTe$, which is the precursor. In order to obtain the quantum dot with the narrower fluorescence half-width, it is more preferable to use Se-DDT/OLAm as the Se material. Although thiol is not limited to a particular kind, for example, octadecanethiol: $C_{18}H_{37}SH$, hexanedecanethiol: $C_{16}H_{33}SH$, tetradecanethiol: $C_{14}H_{29}SH$, dodecanethiol: $C_{12}H_{25}SH$, decanethiol: $C_{10}H_{21}SH$, or octanethiol: $C_8H_{17}SH$ can be used.

Next, an organic zinc compound or an inorganic zinc compound is prepared as the material of ZnSe, ZnSeS, ZnSeTe, or ZnSeTeS. The organic zinc compound and the inorganic zinc compound are materials that are stable in the air and easy to handle. Although the structures of the organic zinc compound and the inorganic zinc compound are not limited to a particular kind, it is preferable to use a highly ionic zinc compound in order to efficiently carry out the metal exchange reaction. For example, the following organic zinc compounds and inorganic zinc compounds can be used. That is to say, zinc acetate: $Zn(OAc)_2$ or zinc nitrate: $Zn(NO_3)_2$ can be used as the acetate, zinc stearate: $Zn(OC(=O)C_{17}H_{35})_2$, zinc oleate: $Zn(OC(=O)C_{17}H_{33})_2$, zinc palmitate: $Zn(OC(=O)C_{15}H_{31})_2$, zinc myristate: $Zn(OC(=O)C_{13}H_{27})_2$, zinc dodecanoate: $Zn(OC(=O)C_{11}H_{23})_2$, or zinc acetylacetonate: $Zn(acac)_2$ can be used as the fatty acid salt, zinc chloride: $ZnCl_2$, zinc bromide: $ZnBr_2$, or zinc iodide: $ZnI_2$ can be used as the halide, zinc diethyldithiocarbamate: $Zn(SC(=S)N(C_2H_5)_2)_2$, zinc dimethyldithiocarbamate: $Zn(SC(=S)N(CH_3)_2)_2$, zinc dibutyldithiocarbamate: $Zn(SC(=S)N(C_4H_9)_2)_2$, or the like can be used as the zinc carbamate.

Subsequently, the above-described organic zinc compound or inorganic zinc compound is added to the reaction solution in which the copper chalcogenide precursor is synthesized. This causes metal exchange reaction between Zn and Cu of copper chalcogenide. It is preferable that the metal exchange reaction occurs at 150° C. or more and 300° C. or less. Furthermore, the metal exchange reaction occurs more preferably at lower temperature, which is 150° C. or more and 280° C. or less, and much more preferably at 150° C. or more and 250° C. or less.

In the present embodiment, it is preferable that the metal exchange reaction between Cu and Zn proceeds quantitatively, and the nanocrystal does not include Cu of the precursor. If Cu of the precursor remains in the nanocrystal, Cu acts as a dopant, and light is emitted by another light emission mechanism to expand the fluorescence half-width.

The residual amount of Cu is preferably 100 ppm or less, more preferably 50 ppm or less, and ideally 10 ppm or less relative to Zn.

In the present embodiment, the ZnSe-based quantum dot synthesized by the cation exchange method tends to leave Cu more than the ZnSe-based quantum dot synthesized by a direct method; however, the ZnSe-based quantum dot synthesized by the cation exchange method can obtain the excellent light-emitting characteristic though Cu is included by about 1 to 10 ppm relative to Zn. Note that whether the quantum dot is the quantum dot synthesized by the cation exchange method can be determined on the basis of the residual amount of Cu. That is to say, synthesizing the quantum dot by the cation exchange method can control the particle diameter with the copper chalcogenide precursor and synthesize the quantum dot that is originally difficult to react; therefore, the residual amount of Cu is advantageous in determining whether the cation exchange method has been used.

In addition, in the present embodiment, when the metal exchange is performed, a compound having an auxiliary role of releasing the metal of the cupper chalcogenide precursor into the reaction solution by coordination or chelate is required.

The compounds having the above-mentioned role may be ligands that can be complexed with Cu. For example, phosphorus-based ligands, amine-based ligands, and sulfur-based ligands are preferable, and among these ligands, phosphorus-based ligands are more preferable because of their high efficiency.

Thus, the metal exchange between Cu and Zn can be performed as appropriate, and the quantum dot having a narrow fluorescence half-width and mainly containing Zn and Se can be manufactured. In the present embodiment, the quantum dots can be mass-produced by the aforementioned cation exchange method as compared to the direct synthesis method.

That is to say, in the direct synthesis method, for example, an organic zinc compound such as diethyl zinc ($Et_2Zn$) is used in order to increase the reactivity of the Zn material. However, since diethyl zinc is highly reactive and ignites in the air, diethyl zinc needs to be handled in inert gas air flow. Thus, it is difficult to handle and keep the material and the reaction using this material involves risks including heat generation and ignition. For these reasons, diethyl zinc is unsuitable for the mass production. Similarly, the reaction using selenium hydride ($H_2Se$) in order to increase the reactivity of the Se material is also unsuitable for the mass production from the viewpoints of the toxicity and safety.

In the aforementioned reaction system using the Zn material or the Se material with the high reactivity, ZnSe is generated but the particle generation is not controlled, and as a result, the fluorescence half-width of the resulting ZnSe is wide.

On the other hand, in the present embodiment, the copper chalcogenide precursor is synthesized from the organic copper compound or the inorganic copper compound and the organic chalcogen compound, and through the metal exchange using the copper chalcogenide precursor, the quantum dot is synthesized. In the present embodiment, first, the quantum dot is synthesized through the synthesis of the cupper chalcogenide precursor, and the quantum dot is not synthesized directly. By such indirect synthesis, it is unnecessary to use the reagent that is dangerous to handle because of too high reactivity, and thus, the ZnSe-based quantum dot with the narrow fluorescence half-width can be safely and stably synthesized.

In the present embodiment, the quantum dot with the desired composition and particle diameter can be obtained by the metal exchange between Cu and Zn in one pot without the isolation or purification of the copper chalcogenide precursor. On the other hand, the copper chalcogenide precursor may be used after isolation and purification once.

In the present embodiment, the synthesized quantum dot exhibits the fluorescence characteristic without requiring various processes including cleaning, isolation and purification, covering, and ligand exchange.

However, covering the core 5a including a nanocrystal such as ZnSe, ZnSeS, ZnSeTe, or ZnSeTeS with the shell 5b such as ZnS or ZnSeS as illustrated in FIG. 1B can increase the fluorescence quantum yield further. By the core-shell structure, the fluorescence lifetime can be made shorter than that before the core is covered with the shell.

In addition, as illustrated in FIG. 1B, by covering the core 5a with the shell 5b, the wavelength can be made shorter or longer than that when the core 5a is used alone. For example, when the particle diameter of the core 5a is small, covering the core 5a with the shell 5b tends to increase the wavelength but when the particle diameter of the core 5a is large, covering the core 5a with the shell 5b tends to decrease the wavelength. The wavelength change value differs depending on the condition of covering with the shell 5b.

Moreover, to the core 5a including the nanocrystal of ZnSe, ZnSeS, ZnSeTe, or ZnSeTeS, or the like obtained by the cation exchange method, the similar material ZnSe, ZnSeS, ZnSeTe, or ZnSeTeS is added. Thus, the core 5a of the quantum dot 5 with the particle size changed to an arbitrary size while the particle size is kept uniform can be obtained. Therefore, the wavelength can be easily controlled to be 410 nm or more and 490 nm or less while the fluorescence half-width is kept 25 nm or less.

In addition, the core-shell structure can be synthesized at the stage of the copper chalcogenide precursor in the present embodiment. For example, by adding the S material continuously to $Cu_2Se$, which is the copper chalcogenide precursor, $Cu_2Se/Cu_2S$ is synthesized and by subsequently performing the metal exchange between Cu and Zn, ZnSe/ZnS can be obtained.

Moreover, in the present embodiment, the S material used for the core-shell structure is not limited to a particular material; however, the following materials can be given typically.

That is to say, thiols including octadecanethiol: $C_{18}H_{37}SH$, hexanedecanethiol: $C_{16}H_{33}SH$, tetradecanethiol: $C_{14}H_{29}SH$, dodecanethiol: $C_{12}H_{25}SH$, decanethiol: $C_{10}H_{21}SH$, octanethiol: $C_8H_{17}SH$, and benezenethiol: $C_6H_5SH$, a solution (S-TOP) in which sulfur is dissolved in a high-boiling-point solvent that is a phosphine hydrocarbon with a long chain, such as trioctylphosphine, a solution (S-ODE) in which sulfur is dissolved in a high-boiling-point solvent that is a hydrocarbon with a long chain, such as octadecene, a solution (S-DDT/OLAm) in which sulfur is dissolved in a mixture of oleylamine and dodecanethiol, or the like can be used.

The reactivity differs depending on the S material to be used, and as a result, the coverage thickness of the shell 5b (for example, ZnS) can be made different. The reactivity of the thiols is in proportion to the decomposing speed thereof, and the reactivity of S-TOP or S-ODE changes in proportion to the stability thereof. Thus, the coverage thickness of the shell 5b can be controlled by using the S material differently, and the final fluorescence quantum yield can also be controlled.

In the present embodiment, the materials described above can be used as the Zn material used for the core-shell structure.

In addition, the optimal coverage thickness can also be calculated from the transition of the fluorescence lifetime. As the covering material is added more times, the particle diameter increases and the fluorescence lifetime becomes shorter gradually. It is understood that since the fluorescence quantum yield also increases at the same time, the fluorescence quantum yield is the highest when the fluorescence lifetime is the shortest.

In the present embodiment, as the solvent used in the covering with the shell 5b includes less amine solvent, the covering with the shell 5b becomes easier and the excellent light-emitting characteristic can be obtained. In addition, the light-emitting characteristic after the covering with the shell 5b is different depending on the ratio of the amine solvent, or the carboxylic or phosphine solvent.

Furthermore, the quantum dots 5 synthesized by the manufacturing method according to the present embodiment can be aggregated when a polar solvent such as methanol, ethanol, or acetone is added, and thus, the quantum dots 5 and the unreacted material can be collected separately. To the collected quantum dots 5, toluene, hexane, or the like is added again so that diffusion is performed again. To the solution in which the diffusion is performed again, the solvent to become the ligand is added; thus, the light-emitting characteristic can be improved further and the stability of the light-emitting characteristic can be improved. The change of the light-emitting characteristic because of the addition of the ligand is different largely depending on whether covering with the shell 5b is performed. In the present embodiment, by adding the thiol ligand to the quantum dot 5 covered with the shell 5b, the fluorescence stability can be improved in particular.

Although the application of the quantum dot 5 illustrated in FIGS. 1A and 1B is not limited to a particular application, for example, the quantum dot 5 according to the present embodiment that emits blue fluorescence can be used for a wavelength conversion member, an illumination member, a backlight device, a display device, or the like.

When the quantum dot 5 according to the present embodiment is used for a part of the wavelength conversion member, the illumination member, the backlight device, the display device, or the like and, for example, photoluminescence (PL) is employed as a light-emitting principle, UV radiation from a light source makes it possible to emit blue fluorescence. Alternatively, in the case where electroluminescence (EL) is employed as the light-emitting principle, or in the case where the light of all the three primary colors is emitted from the quantum dots by another method, a light-emitting element emitting blue fluorescence using the quantum dot 5 according to the present embodiment can be obtained. In the present embodiment, white light can be emitted by using a light-emitting element (full color LED) including the quantum dots 5 according to the present embodiment emitting the blue fluorescence together with the quantum dots emitting green fluorescence and the quantum dots emitting red fluorescence.

Figure 2:
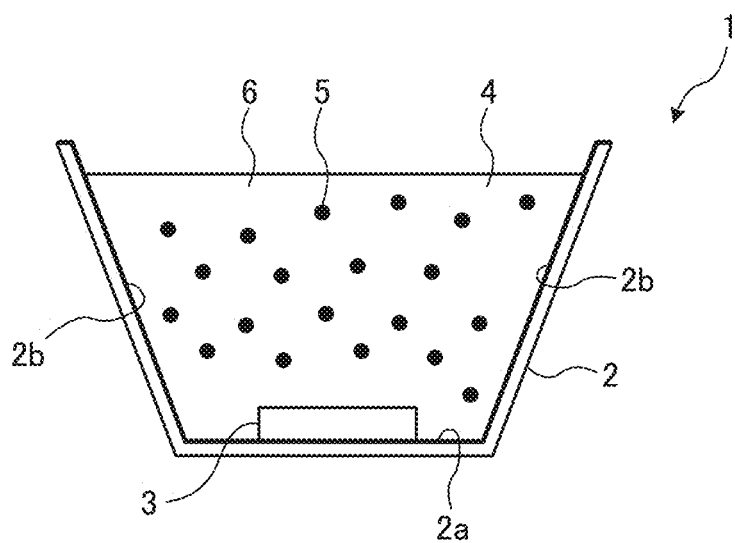
FIG. 2 is a schematic diagram of an LED device including the quantum dots according to the embodiment of the present invention.

FIG. 2 is a schematic diagram of an LED device including the quantum dots according to the present embodiment. An LED device 1 according to the present embodiment includes: a housing case 2 including a bottom surface 2a, and a side wall 2b that surrounds the periphery of the bottom surface 2a; an LED chip (light-emitting element) 3 disposed on the bottom surface 2a of the housing case 2; and a fluorescence layer 4 that fills the housing case 2 and seals an upper surface side of the LED chip 3 as illustrated in FIG. 2. Here, the upper surface side corresponds to a direction where the light generated in the LED chip 3 is released from the housing case 2, and a direction opposite to the bottom surface 2a with respect to the LED chip 3.

The LED chip 3 may be disposed on a base wiring board, which is not shown, and the base wiring board may form the bottom surface part of the housing case 2. The base board may have a structure in which, for example, a wiring pattern is formed on a base material made of glass epoxy resin or the like.

The LED chip 3 is a semiconductor element that emits light when voltage is applied in a forward direction, and has a basic structure in which a P-type semiconductor layer and an N-type semiconductor layer are bonded through PN junction.

As illustrated in FIG. 2, the fluorescence layer 4 is formed of resin 6 in which a number of quantum dots 5 are diffused.

The resin composition in which the quantum dots 5 according to the present embodiment are diffused may include the quantum dots 5 and other fluorescence material than the quantum dots 5. Examples of the fluorescence material include sialons or KSF ($K_2SiF_6$:$Mn^{4+}$) red fluorescent body and there is no particular limitation on the material.

The resin 6 that forms the fluorescence layer 4 is not limited to a particular resin, and may be polypropylene (PP), polystyrene (PS), acrylic resin, methacrylate, MS resin, polyvinyl chloride (PVC), polycarbonate (PC), polyethylene terephthalate (PET), polyethylene naphthalate (PEN), polymethylpentene, liquid crystal polymer, epoxy resin, silicone resin, a mixture containing any of those, or the like.

Figure 3:
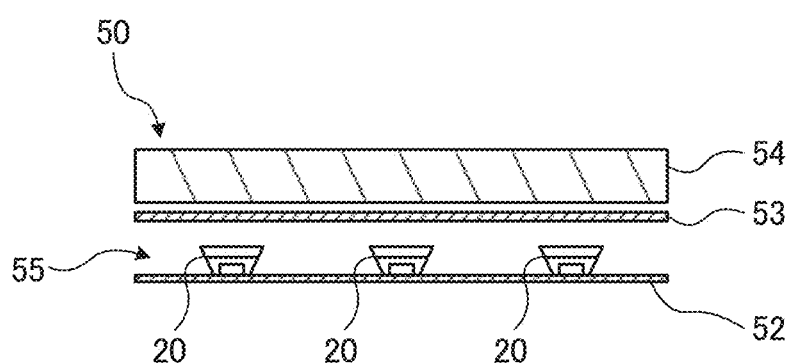
FIG. 3 is a longitudinal cross-sectional view of a display device including the LED device according to the embodiment of the present invention.

The LED device including the quantum dots according to the present embodiment can be used for a display device. FIG. 3 is a longitudinal cross-sectional view of a display device including the LED device illustrated in FIG. 2. As illustrated in FIG. 3, a display device 50 includes a plurality of LED devices 20, and a display unit 54 such as a liquid crystal display that faces the LED devices 20. Each LED device 20 is disposed on a back surface side of the display unit 54. Each LED device 20 has a structure in which the LED chip is sealed with resin in which a number of quantum dots 5 are diffused in a manner similar to the LED device 1 illustrated in FIG. 2.

As illustrated in FIG. 3, the LED devices 20 are supported by a supporter 52. The LED devices 20 are arranged with a predetermined distance therebetween. The LED devices 20 and the supporter 52 constitute a backlight 55 for the display unit 54. The shape and material of the supporter 52 are not limited in particular; for example, the supporter 52 may have a shape like a sheet, a plate, or a case. As illustrated in FIG. 3, a light diffusing plate 53 or the like may be provided between the backlight 55 and the display unit 54.

By using the quantum dot 5 with the narrow fluorescence half-width in the present embodiment for the LED device illustrated in FIG. 2, the display device illustrated in FIG. 3, or the like, the light-emitting characteristic of the device can be improved effectively.

Moreover, the resin composition in which the quantum dots 5 according to the present embodiment are diffused in the resin can be formed to have a shape like a sheet or a film. Such a sheet or film can be incorporated in the backlight device, for example.

In the present embodiment, the wavelength conversion member in which the quantum dots are diffused in the resin can be formed of a molded body. For example, a molded body in which the quantum dots are diffused in the resin is housed in a container having an accommodation space by press-fitting or the like. At this time, the refractive index of the molded body is preferably smaller than the refractive index of the container. Thus, part of the light entering the molded body is totally reflected by an inner wall of the container. Therefore, the beam of light leaking to the outside from the side of the container can be reduced. By using the quantum dots having the narrow fluorescence half-width in the present embodiment for the wavelength conversion member, the illumination member, the backlight device, the display device, or the like, the light-emitting characteristic can be effectively improved.

EXAMPLES

Hereinafter, the effects of the present invention will be described by examples of the present invention and comparative examples. The present invention is not limited at all by the following examples.

In the present invention, the following materials were used to synthesize a quantum dot not including Cd. To evaluate the synthesized quantum dot, the following measurement instruments were used.
<Materials>
Copper acetate anhydride: manufactured by Wako Pure Chemical Corporation
Octadecene: manufactured by Idemitsu Kosan Co., Ltd.
Oleylamine: Pharmin manufactured by Kao Corporation
Oleic acid: LUNAC O-V manufactured by Kao Corporation
Dodecane thiol (Se-DDT): Thiokalkol 20 manufactured by Kao Corporation
Trioctylphosphine: manufactured by HOKKO CHEMICAL INDUSTRY CO., LTD.
Zinc acetate anhydride: manufactured by KISHIDA CHEMICAL Co., Ltd.
Selenium (4N: 99.99%): manufactured by Shinko Chemical Co., Ltd.
Sulfur: manufactured by KISHIDA CHEMICAL Co., Ltd.
<Measurement Instruments>
Fluorescence spectrometer: F-2700 manufactured by JASCO Corporation
Ultraviolet-visible light spectrophotometer: V-770 manufactured by Hitachi, Ltd.
Quantum yield measurement apparatus: QE-1100 manufactured by Otsuka Electronics Co., Ltd.
X-ray diffractometer (XRD): D2 PHASER manufactured by Bruker Scanning electron microscope (SEM): SU 9000 manufactured by Hitachi, Ltd.
Fluorescence lifetime measurement apparatus: C11367 manufactured by Hamamatsu Photonics K.K.

Example 1

In a 300-mL reaction vessel, 546 mg of copper acetate anhydride: $Cu(OAc)_2$, 28.5 mL of oleylamine: OLAm, and 46.5 mL of octadecene: ODE were input. Then, the materials were dissolved with heat while stirring at 150° C. for 20 minutes under an inert gas ($N_2$) atmosphere.
To this solution, 8.4 mL of the Se-DDT/OLAm solution (0.285 M) was added and the mixture was heated at 150° C. for 10 minutes while stirring. The resulting reaction solution (CuSe) was cooled to room temperature.

After that, 4.092 g of zinc acetate anhydride: $Zn(OAc)_2$, 60 mL of trioctylphosphine: TOP, and 2.4 mL of oleylamine: OLAm were input into the $Cu_2Se$ reaction solution. Then, the mixture was heated at 180° C. for 30 minutes while stirring under the inert gas ($N_2$) atmosphere. The resulting reaction solution (ZnSe) was cooled to room temperature.

Ethanol was added to the reaction solution, which was cooled to room temperature, to generate a precipitate and through the centrifugal separation, the precipitate was collected. To this precipitate, 72 mL of octadecene: ODE was added and diffusion was performed.

After that, to 72 mL of the ZnSe-ODE solution, 4.092 g of zinc acetate anhydride: $Zn(OAc)_2$, 30 mL of trioctylphosphine: TOP, 3 mL of oleylamine: OLAm, and 36 mL of oleic acid were added. Then, the mixture was heated at 280° C. for 30 minutes while stirring under the inert gas ($N_2$) atmosphere. The resulting reaction solution (ZnSe) was cooled to room temperature.

The obtained reaction solution was measured by the fluorescence spectrometer. As a result, an optical characteristic having a fluorescence wavelength of about 430.5 nm and a fluorescence half-width of about 15 nm was obtained.

The obtained reaction solution was measured by the quantum efficiency measurement system. As a result, the fluorescence quantum yield was about 30%. In addition, the result of measuring the fluorescence lifetime was 48 ns.

Figure 7A:
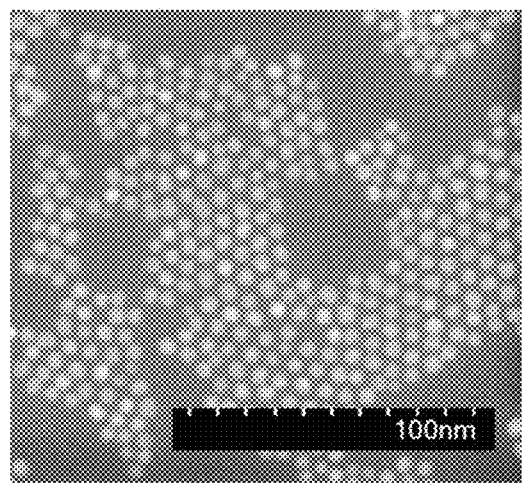
FIG. 7A is a scanning electron microscopy (SEM) photograph of ZnSe in Example 1.
Figure 7B:
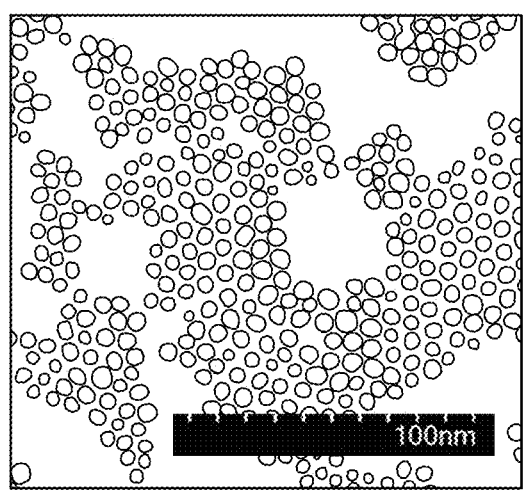
FIG. 7B is a schematic diagram of FIG. 7A.
Figure 13:
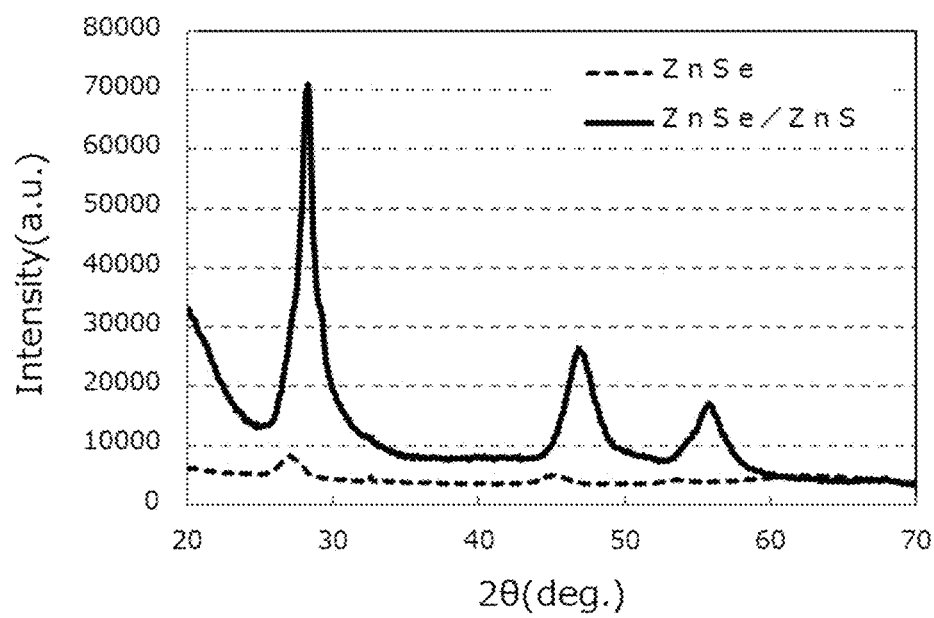
FIG. 13 expresses an Xray diffraction (XRD) spectrum of ZnSe and ZnSe/ZnS in Example 1.

The obtained solution in which the ZnSe particles were diffused was measured using the scanning electron microscope (SEM) and the X-ray diffraction (XRD) apparatus. FIG. 7A expresses a measurement result of the scanning electron microscope (SEM), and FIG. 7B is a schematic diagram of FIG. 7A. A dotted line in FIG. 13 expresses a measurement result of the X-ray diffraction (XRD). The result of SEM indicates that the particle diameter was about 5 nm. Moreover, the result of XRD indicates that the crystal is a cubic crystal and the crystal peak position coincides with that of ZnSe.

Ethanol was added to 47 mL of the ZnSe reaction solution, which was obtained separately from the aforementioned solution, to generate a precipitate, and through the centrifugal separation, the precipitate was collected. To this precipitate, 35 mL of octadecene: ODE was added and diffusion was performed.

Under the inert gas ($N_2$) atmosphere, 35 mL of the ZnSe-ODE solution after the diffusion was heated at 310° C. for 20 minutes while stirring.

To this solution, 1.1 mL of a mixed solution including 2.2 mL of a S-TOP solution (2.2 M) and 11 mL of a zinc oleate: $Zn(OLAc)_2$ solution (0.8 M) was added, and the mixture was heated at 310° C. for 20 minutes while stirring. This operation was repeated 12 times. The resulting reaction solution (ZnSe/ZnS) was cooled to room temperature.

Ethanol was added to the obtained reaction solution to generate a precipitate, and through the centrifugal separation, the precipitate was collected. To this precipitate, hexane was added and diffusion was performed.

ZnSe/ZnS diffused in hexane was measured by the fluorescence spectrometer. As a result, as expressed in FIG. 4, an optical characteristic having a fluorescence wavelength of about 423 nm and a fluorescence half-width of about 15 nm was obtained.

The similar solution was measured by the quantum efficiency measurement system. As a result, the fluorescence quantum yield was about 60%. The result of measuring the fluorescence lifetime was 44 ns.

Figure 8A:
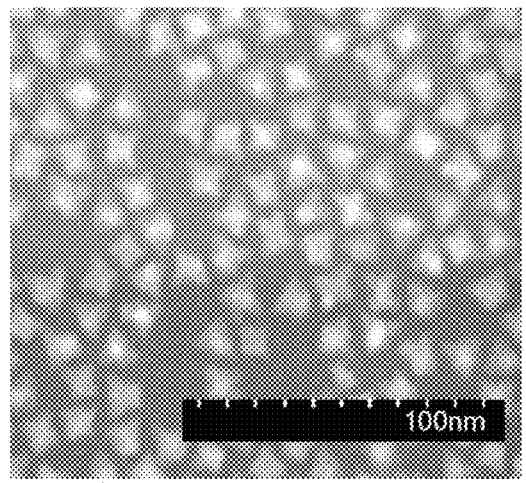
FIG. 8A is a SEM photograph of ZnSe/ZnS in Example 1.
Figure 8B:
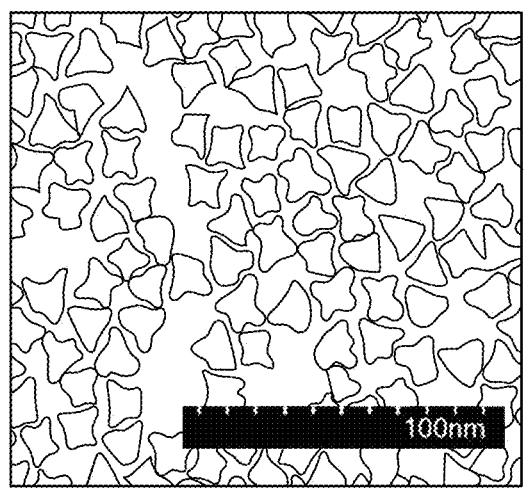
FIG. 8B is a schematic diagram of FIG. 8A.

In addition, the obtained solution in which the ZnSe/ZnS particles were diffused was measured using the scanning electron microscope (SEM) and the X-ray diffraction (XRD) apparatus. FIG. 8A expresses a measurement result of the scanning electron microscope (SEM), and FIG. 8B is a schematic diagram of FIG. 8A. A solid line in FIG. 13 expresses a measurement result of the X-ray diffraction (XRD). The result of SEM indicates that the particle diameter was about 12 nm. Moreover, the result of XRD indicates that the crystal is a cubic crystal and the maximum peak intensity shifts to the 1.1° higher angle side than the crystal peak position of ZnSe.

Example 2

In a 100-mL reaction vessel, 91 mg of copper acetate anhydride: $Cu(OAc)_2$, 4.8 mL of oleylamine: OLAm, and 7.75 mL of octadecene: ODE were input. Then, the materials were dissolved with heat at 150° C. for 5 minutes while stirring under the inert gas ($N_2$) atmosphere.

To this solution, 1.4 mL of the Se-DDT/OLAm solution (0.285 M) was added and the mixture was heated at 150° C. for 30 minutes while stirring. The resulting reaction solution ($Cu_2Se$) was cooled to room temperature.

After that, in the $Cu_2Se$ reaction solution, 682 mg of zinc acetate anhydride: $Zn(OAc)_2$, 10 mL of trioctylphosphine: TOP, and 0.4 mL of oleylamine: OLAm were input. Then, the mixture was heated at 180° C. for 10 minutes while stirring under the inert gas ($N_2$) atmosphere. The resulting reaction solution (ZnSe) was cooled to room temperature.

Ethanol was added to the reaction solution, which was cooled to room temperature, to generate a precipitate, and through the centrifugal separation, the precipitate was collected. To this precipitate, 12 mL of octadecene: ODE was added and diffusion was performed.

After that, to 12 mL of the ZnSe-ODE solution, 682 mg of zinc acetate anhydride: $Zn(OAc)_2$, 5 mL of trioctylphosphine: TOP, 0.5 mL of oleylamine: OLAm, and 6 mL of oleic acid: OLAc were added. Then, the mixture was heated at 280° C. for 30 minutes while stirring under the inert gas ($N_2$) atmosphere. The resulting reaction solution (ZnSe) was cooled to room temperature.

The obtained reaction solution was measured by the fluorescence spectrometer. As a result, an optical characteristic having a fluorescence wavelength of about 437 nm and a fluorescence half-width of about 15 nm was obtained.

Ethanol was added to the obtained reaction solution (about several milliliters) to generate a precipitate, and through the centrifugal separation, the precipitate was collected. To this precipitate, hexane was added and diffusion was performed.

ZnSe diffused in hexane was measured by the quantum efficiency measurement system. As a result, the fluorescence quantum yield was about 37%. The result of measuring the fluorescence lifetime was 13 ns.

Figure 9A:
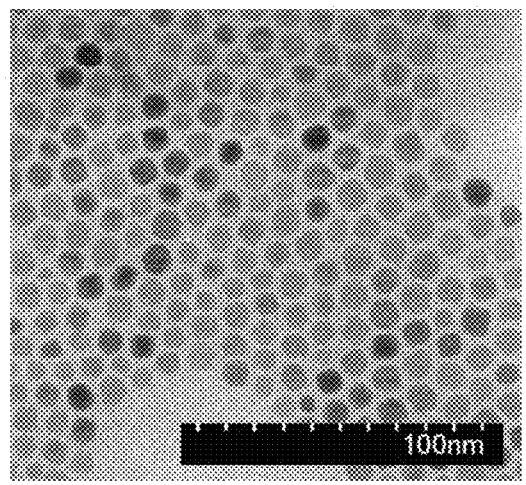
FIG. 9A is a SEM photograph of ZnSe in Example 2.
Figure 9B:
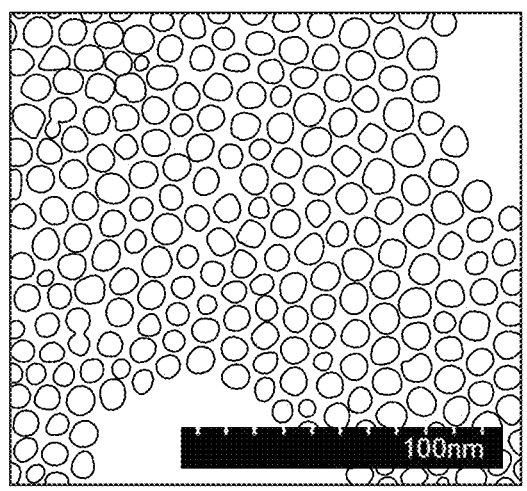
FIG. 9B is a schematic diagram of FIG. 9A.
Figure 14:
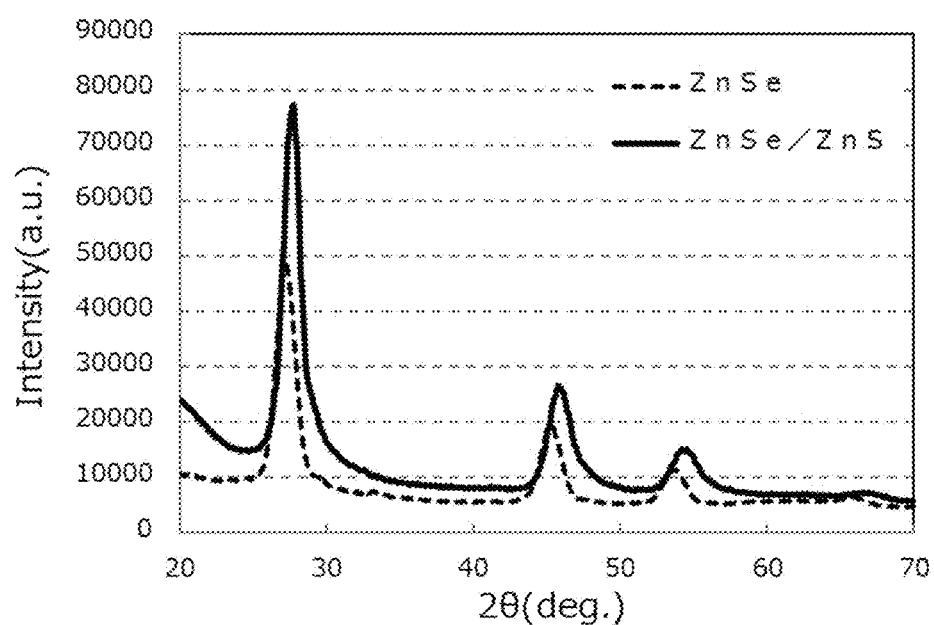
FIG. 14 expresses the XRD spectrum of ZnSe and ZnSe/ZnS in Example 2.

The measurement was performed using the scanning electron microscope (SEM) and the X-ray diffraction (XRD) apparatus. FIG. 9A expresses a measurement result of the scanning electron microscope (SEM), and FIG. 9B is a schematic diagram of FIG. 9A. A dotted line in FIG. 14 expresses a measurement result of the X-ray diffraction (XRD). The result of SEM indicates that the particle diameter was about 6.0 nm. Moreover, the result of XRD indicates that the crystal is a cubic crystal and the crystal peak position coincides with that of ZnSe.

Ethanol was added to 23 mL of the ZnSe reaction solution, which was obtained separately from the aforementioned solution, to generate a precipitate, and through the centrifugal separation, the precipitate was collected. To this precipitate, 17.5 mL of octadecene: ODE was added and diffusion was performed.

To 17.5 mL of the ZnSe-ODE solution after the diffusion, 1 mL of oleic acid: OLAc and 2 mL of trioctylphosphine: TOP were added. Then, the mixture was heated at 320° C. for 10 minutes while stirring under the inert gas ($N_2$) atmosphere.

To this solution, 0.5 mL of a mixed solution including 1 mL of an S-TOP solution (1 M) and 5 mL of a zinc oleate: $Zn(OLAc)_2$ solution (0.4 M) was added and the mixture was heated at 320° C. for 10 minutes while stirring. This operation was repeated 8 times.

After that, 2 mL of oleic acid: OLAc was added and the mixture was subject to reaction at 320° C. for 10 minutes, and then 2 mL of trioctylphosphine: TOP was added thereto and the resulting mixture was heated at 320° C. for 10 minutes while stirring. The obtained reaction solution (ZnSe/ZnS) was cooled to room temperature.

Figure 5:
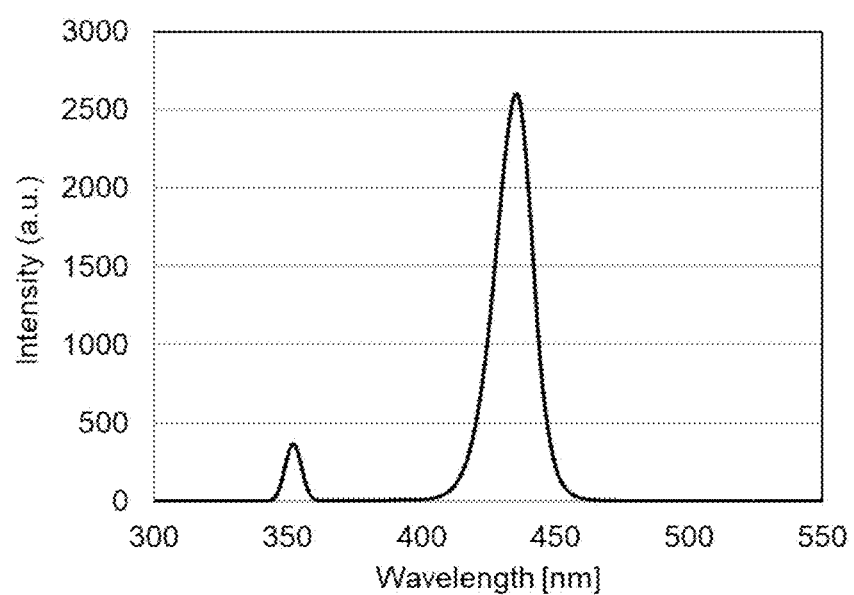
FIG. 5 expresses the PL spectrum of ZnSe/ZnS in Example 2.

The obtained reaction solution was measured by the fluorescence spectrometer. As a result, as illustrated in FIG. 5, an optical characteristic having a fluorescence wavelength of about 435 nm and a fluorescence half-width of about 16 nm was obtained.

Ethanol was added to the resulting reaction solution to generate a precipitate, and through the centrifugal separation, the precipitate was collected. To this precipitate, hexane was added and diffusion was performed.

ZnSe/ZnS diffused in hexane was measured by the quantum efficiency measurement system. As a result, the fluorescence quantum yield was about 81%. The result of measuring the fluorescence lifetime was 12 ns.

Figure 10A:
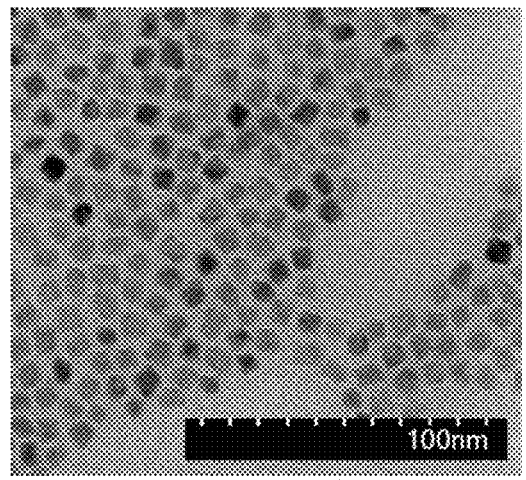
FIG. 10A is a SEM photograph of ZnSe/ZnS in Example 2.
Figure 10B:
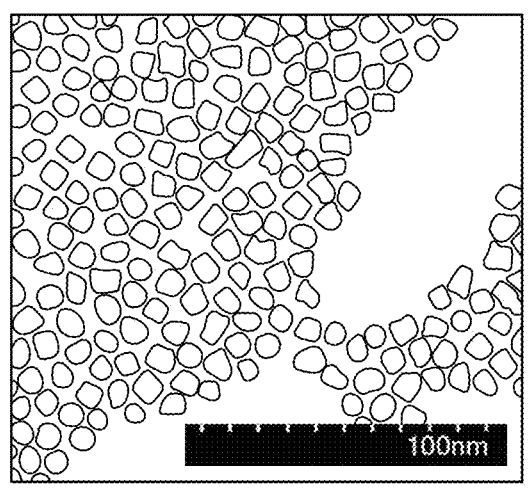
FIG. 10B is a schematic diagram of FIG. 10A.

The measurement was performed using the scanning electron microscope (SEM) and the X-ray diffraction (XRD) apparatus. FIG. 10A expresses a measurement result of the scanning electron microscope (SEM), and FIG. 10B is a schematic diagram of FIG. 10A. A solid line in FIG. 14 expresses a measurement result of the X-ray diffraction (XRD). The result of SEM indicates that the particle diameter was about 8.5 nm. Moreover, the result of XRD indicates that the crystal is a cubic crystal and the maximum peak intensity shifts to the 0.4° higher angle side than the crystal peak position of ZnSe.

Example 3

In a 100-mL reaction vessel, 91 mg of copper acetate anhydride: $Cu(OAc)_2$, 4.8 mL of oleylamine: OLAm, and 7.75 mL of octadecene: ODE were input. Then, the materials were dissolved with heat at 170° C. for 5 minutes while stirring under the inert gas ($N_2$) atmosphere.

To this solution, 1.4 mL of the Se-DDT/OLAm solution (0.285 M) was added and the mixture was heated at 170° C. for 30 minutes while stirring. The obtained reaction solution (CuSe) was cooled to room temperature.

After that, in the $Cu_2Se$ reaction solution, 922 mg of zinc acetate anhydride: $Zn(OAc)_2$, 10 mL of trioctylphosphine: TOP, and 0.4 mL of oleylamine: OLAm were input. Then, the mixture was heated at 180° C. for 30 minutes while stirring under the inert gas ($N_2$) atmosphere. The obtained reaction solution (ZnSe) was cooled to room temperature.

Ethanol was added to the reaction solution, which was cooled to room temperature, to generate a precipitate and through the centrifugal separation, the precipitate was collected. To this precipitate, 12 mL of octadecene: ODE was added and diffusion was performed.

After that, to 12 mL of the ZnSe-ODE solution, 922 mg of zinc acetate anhydride: $Zn(OAc)_2$, 5 mL of trioctylphosphine: TOP, 0.5 mL of oleylamine: OLAm, and 3 mL of oleic acid: OLAc were input. Then, the mixture was heated at 280° C. for 20 minutes while stirring under the inert gas ($N_2$) atmosphere. The resulting reaction solution (ZnSe) was cooled to room temperature.

The obtained reaction solution was measured by the fluorescence spectrometer. As a result, an optical characteristic having a fluorescence wavelength of about 448 nm and a fluorescence half-width of about 15 nm was obtained.

Ethanol was added to the obtained reaction solution to generate a precipitate and through the centrifugal separation, the precipitate was collected. To this precipitate, hexane was added and diffusion was performed.

ZnSe diffused in hexane was measured by the quantum efficiency measurement system. As a result, the fluorescence quantum yield was about 6%. The result of measuring the fluorescence lifetime was 25 ns.

Figure 11A:
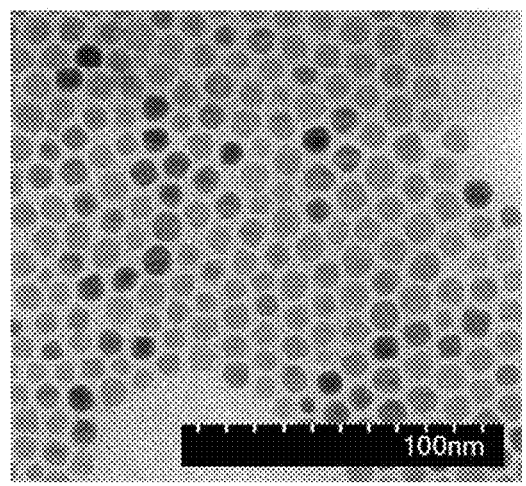
FIG. 11A is a SEM photograph of ZnSe in Example 3.
Figure 11B:
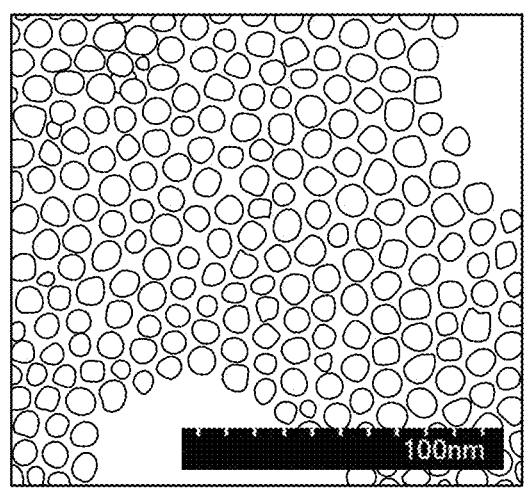
FIG. 11B is a schematic diagram of FIG. 11A.
Figure 15:
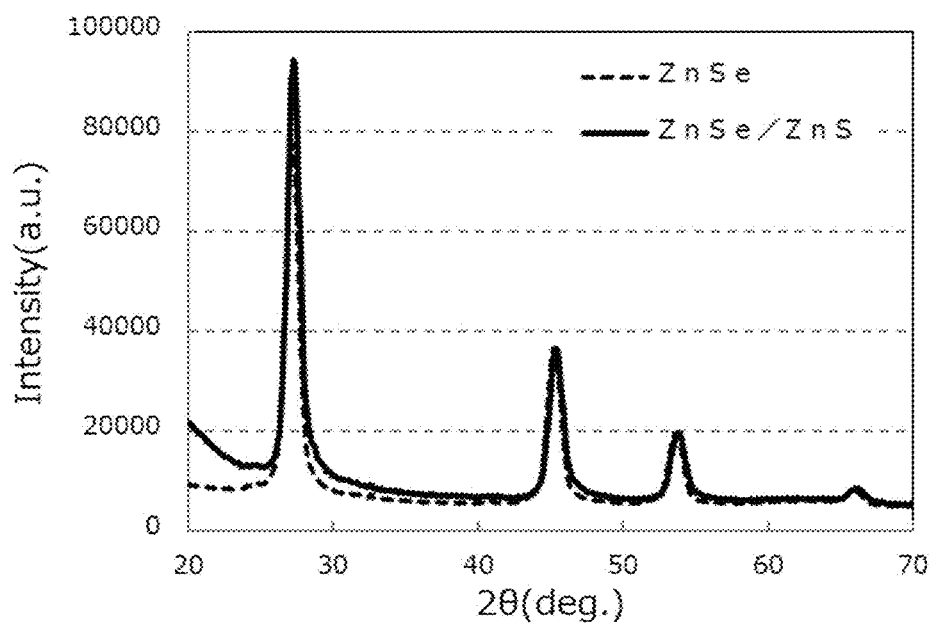
FIG. 15 expresses the XRD spectrum of ZnSe and ZnSe/ZnS in Example 3.

The measurement was performed using the scanning electron microscope (SEM) and the X-ray diffraction (XRD) apparatus. FIG. 11A expresses a measurement result of the scanning electron microscope (SEM), and FIG. 11B is a schematic diagram of FIG. 11A. A dotted line in FIG. 15 expresses a measurement result of the X-ray diffraction (XRD). The result of SEM indicates that the particle diameter was about 8.2 nm. Moreover, the result of XRD indicates that the crystal is a cubic crystal and the crystal peak position coincides with that of ZnSe.

Ethanol was added to 20 mL of the ZnSe reaction solution, which was obtained separately from the aforementioned solution, to generate a precipitate, and through the centrifugal separation, the precipitate was collected. To this precipitate, 17.5 mL of octadecene: ODE was added and diffusion was performed.

To 17.5 mL of the ZnSe-ODE solution after the diffusion, 1 mL of oleic acid: OLAc, and 2 mL of trioctylphosphine: TOP were added. Then, the mixture was heated at 320° C. for 10 minutes while stirring under the inert gas ($N_2$) atmosphere.

To this solution, 0.5 mL of a mixed solution including 0.2 mL of DDT, 0.8 mL of trioctylphosphine: TOP, and 5 mL of a zinc oleate: $Zn(OLAc)_2$ solution (0.4 M) was added. Then, the mixture was heated at 320° C. for 10 minutes while stirring. This operation was repeated 8 times.

After that, 2 mL of oleic acid: OLAc was added and the mixture was subject to reaction at 320° C. for 10 minutes, and then 2 mL of trioctylphosphine: TOP was added thereto. The resulting mixture was heated at 320° C. for 10 minutes while stirring. The obtained reaction solution (ZnSe/ZnS) was cooled to room temperature.

Figure 6:
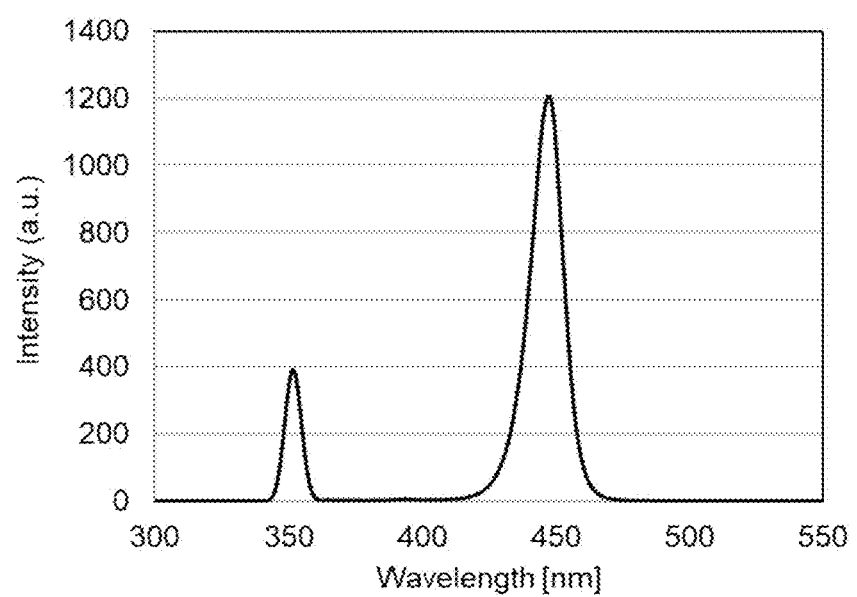
FIG. 6 expresses the PL spectrum of ZnSe/ZnS in Example 3.

The obtained reaction solution was measured by the fluorescence spectrometer. As a result, as illustrated in FIG. 6, an optical characteristic having a fluorescence wavelength of about 447 nm and a fluorescence half-width of about 14 nm was obtained.

Ethanol was added to the obtained reaction solution to generate a precipitate and through the centrifugal separation, the precipitate was collected. To this precipitate, hexane was added and diffusion was performed.

ZnSe/ZnS diffused in hexane was measured by the quantum efficiency measurement system. As a result, the fluorescence quantum yield was about 62%. The result of measuring the fluorescence lifetime was 16 ns.

Figure 12A:
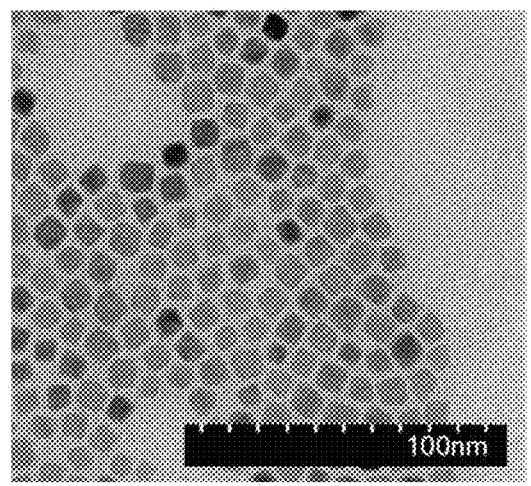
FIG. 12A is a SEM photograph of ZnSe/ZnS in Example 3.
Figure 12B:
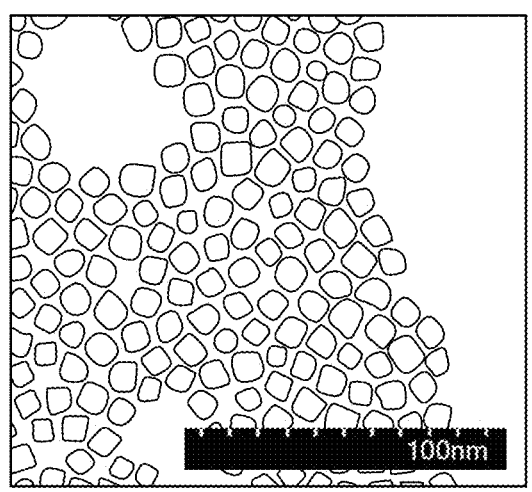
FIG. 12B is a schematic diagram of FIG. 12A.
Figure 16:
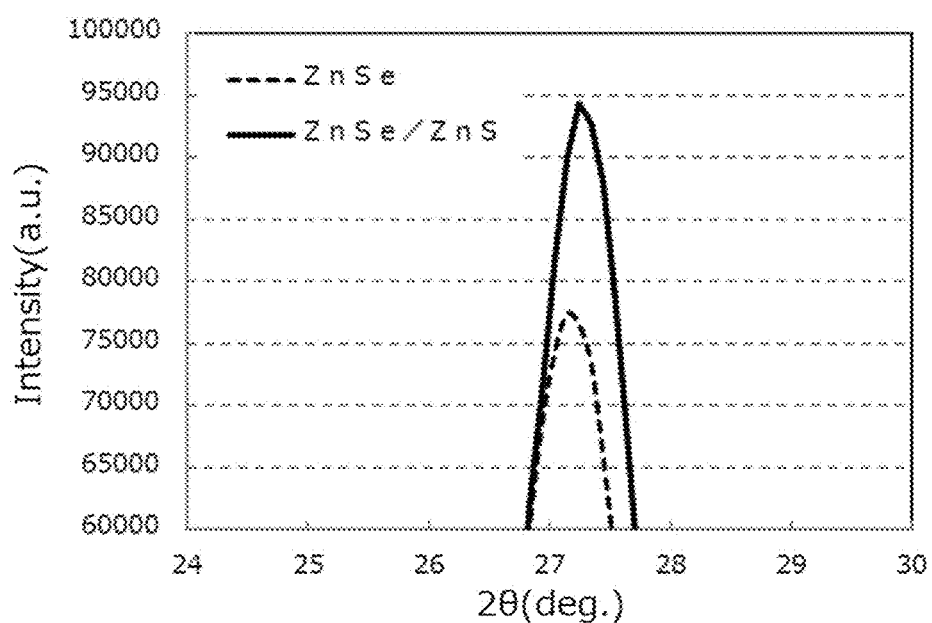
FIG. 16 is a magnified view of the XRD spectrum in FIG. 15.

The measurement was performed using the scanning electron microscope (SEM) and the X-ray diffraction (XRD) apparatus. FIG. 12A expresses a measurement result of the scanning electron microscope (SEM), and FIG. 12B is a schematic diagram of FIG. 12A. A solid line in FIG. 15 expresses a measurement result of the X-ray diffraction (XRD). The result of SEM indicates that the particle diameter was about 9.8 nm. Moreover, the result of XRD indicates that the crystal is a cubic crystal. FIG. 16 expresses the result of magnifying the maximum peak intensity in FIG. 15. Thus, it is understood that the maximum peak intensity shifts to the 0.1° higher angle side than the crystal peak position of ZnSe.

Example 4

In a 100-mL reaction vessel, 91 mg of copper acetate anhydride: $Cu(OAc)_2$, 4.8 mL of oleylamine: OLAm, and 7.75 mL of octadecene: ODE were input. Then, the materials were dissolved with heat at 150° C. for 5 minutes while stirring under the inert gas ($N_2$) atmosphere.

To this solution, 1.4 mL of the Se-DDT/OLAm solution (0.285 M) was added and the mixture was heated at 150° C. for 30 minutes while stirring.

To this solution, a mixed solution including 0.1 mL of the TOP solution of Te (0.5 M) and 2.5 mL of the ODE solution of Se (0.1 M) was dropped for one minute. After that, the mixture was heated at 150° C. for 30 minutes while stirring. The obtained reaction solution (CuSeTe) was cooled to room temperature.

After that, to the CuSeTe reaction solution, 682 mg of zinc acetate anhydride: $Zn(OAc)_2$, 10 mL of trioctylphosphine: TOP, and 0.4 mL of oleylamine: OLAm were added. The mixture was heated at 180° C. for 20 minutes while stirring under the inert gas ($N_2$) atmosphere.

Ethanol was added to the reaction solution, which was cooled to room temperature, to generate a precipitate and through the centrifugal separation, the precipitate was collected. To this precipitate, 12 mL of octadecene: ODE was added and diffusion was performed.

After that, to 12 mL of the ZnSeTe-ODE solution, 922 mg of zinc acetate anhydride: $Zn(OAc)_2$, 5 mL of trioctylphosphine: TOP, and 0.5 mL of oleylamine: OLAm were added. Then, the mixture was heated at 180° C. for 20 minutes while stirring under the inert gas ($N_2$) atmosphere. The resulting reaction solution (ZnSeTe) was cooled to room temperature.

Ethanol was added to 8.7 mL of the obtained ZnSeTe reaction solution to generate a precipitate, and through the centrifugal separation, the precipitate was collected. To this precipitate, 8.75 mL of octadecene: ODE was added and diffusion was performed.

To 8.75 mL of the ZnSeTe-ODE solution after the diffusion, 0.5 mL of oleic acid: OLAc and 1 mL of trioctylphosphine: TOP were added. Then, the mixture was heated at 320° C. for 10 minutes while stirring under the inert gas ($N_2$) atmosphere.

To this solution, 0.25 mL of a mixed solution including 0.25 mL of an Se-TOP solution (1 M) and 2.5 mL of a zinc oleate: $Zn(OLAc)_2$ solution (0.4 M) was added. Then, the mixture was heated at 320° C. for 10 minutes while stirring. This operation was repeated 6 times and then, the mixture was cooled to room temperature.

The resulting ZnSeTe/ZnSe reaction solution was measured by the fluorescence spectrometer. As a result, an optical characteristic having a fluorescence wavelength of about 461 nm and a fluorescence half-width of about 24 nm was obtained.

Example 5

In a 100-mL reaction vessel, 91 mg of copper acetate anhydride: $Cu(OAc)_2$, 4.8 mL of oleylamine: OLAm, and 7.75 mL of octadecene: ODE were input. Then, the materials were dissolved with heat at 180° C. for 5 minutes while stirring under the inert gas ($N_2$) atmosphere.

To this solution, 1.4 mL of the Se-DDT/OLAm solution (0.285 M) was added and the mixture was heated at 180° C. for 30 minutes while stirring.

To this solution, a mixed solution including 0.1 mL of the TOP solution of Te (0.5 M) and 1.35 mL of the ODE solution of Se (0.1 M) was dropped for one minute. After that, the mixture was heated at 180° C. for 20 minutes while stirring. The resulting reaction solution (CuSeTe) was cooled to room temperature.

After that, to the CuSeTe reaction solution, 682 mg of zinc acetate anhydride: $Zn(OAc)_2$, 7.5 mL of trioctylphosphine: TOP, and 0.25 mL of oleylamine: OLAm were added. Then, the mixture was heated at 180° C. for 20 minutes while stirring under the inert gas ($N_2$) atmosphere.

Ethanol was added to the reaction solution, which was cooled to room temperature, to generate a precipitate and through the centrifugal separation, the precipitate was collected. To this precipitate, 12 mL of octadecene: ODE was added and diffusion was performed.

After that, to 12 mL of the ZnSeTe-ODE solution, 682 mg of zinc acetate anhydride: $Zn(OAc)_2$, 7.5 mL of trioctylphosphine: TOP, and 0.25 mL of oleylamine: OLAm were added. Then, the mixture was heated at 180° C. for 20 minutes while stirring under the inert gas ($N_2$) atmosphere. The resulting reaction solution (ZnSeTe) was cooled to room temperature.

Ethanol was added to 10 mL of the obtained ZnSeTe reaction solution to generate a precipitate and through the centrifugal separation, the precipitate was collected. To this precipitate, 8.75 mL of octadecene: ODE was added and diffusion was performed.

To 8.75 mL of the ZnSeTe-ODE solution after the diffusion, 0.5 mL of oleic acid: OLAc and 1 mL of trioctylphosphine: TOP were added. Then, the mixture was heated at 320° C. for 10 minutes while stirring under the inert gas ($N_2$) atmosphere.

To this solution, 2.5 mL of a mixed solution including 0.25 mL of the Se-TOP solution (1 M) and 5 mL of the zinc oleate: $Zn(OLAc)_2$ solution (0.4 M) was added. Then, the mixture was heated at 320° C. for 10 minutes while stirring. This operation was repeated 4 times and then, the mixture was cooled to room temperature.

The resulting ZnSeTe/ZnSe reaction solution was measured by the fluorescence spectrometer. As a result, an optical characteristic having a fluorescence wavelength of about 479 nm and a fluorescence half-width of about 23 nm was obtained.

Examples 1 to 5 are summarized in Table 1 below. By changing the condition of synthesizing CuSe or CuSeTe, the fluorescence half-width was controlled to be 25 nm or less and the fluorescence wavelength was controlled to be in the range of 410 nm to 490 nm (preferably, 420 nm to 480 nm).

TABLE 1

| | Composition of quantum dot | Fluorescence wavelength | Fluorescence half-width |
|---|---|---|---|
| Example 1 | ZnSe/ZnS | 423 nm | 15 nm |
| Example 2 | ZnSe/ZnS | 435 nm | 16 nm |
| Example 3 | ZnSe/ZnS | 447 nm | 14 nm |

TABLE 1-continued

| | Composition of quantum dot | Fluorescence wavelength | Fluorescence half-width |
|---|---|---|---|
| Example 4 | ZnSeTe/ZnS | 461 nm | 24 nm |
| Example 5 | ZnSeTe/ZnSe | 479 nm | 23 nm |

In Examples 1 to 3, the fluorescence wavelength was controlled by enlarging the particle of $Cu_2Se$ in a manner that the reaction temperature and time are increased. However, it has been difficult to achieve a fluorescence wavelength of 450 nm or more with the ZnSe core. In view of this, ZnSeTe was synthesized through cation exchange after CuSeTe was synthesized; thus, a fluorescence particle with a fluorescence wavelength in the 460 nm range or 470 nm range was obtained.

The characteristic point of the ZnSeTe quantum dot in Examples 4 and 5 is that the fluorescence half-width can be controlled to be 25 nm or less and the fluorescence wavelength can be controlled to be in the range of 420 nm to 480 nm.

Note that the ZnSeTe quantum dot obtained by the direct reaction of Zn, Se, and Te has conventionally been known and the fluorescence half-width thereof is 25 nm or more.

In Example 3 (similarly in Examples 7 and 8 below), the fluorescence wavelength is 447 nm, and a fluorescence wavelength of around 450 nm can be secured and the high fluorescence quantum efficiency can be obtained. When ZnSe is generated by the direct synthesis method, the particle tends to become large and a defect is easily formed inside; thus, the fluorescence quantum efficiency tends to decrease. On the other hand, in Example 3, the high fluorescence quantum efficiency can be secured.

It is presumed that the results in Examples 3 to 5 come from the cation exchange.

Example 6

In a 100-mL reaction vessel, 182 mg of copper acetate anhydride: $Cu(OAc)_2$, 4.8 mL of oleylamine: OLAm, and 7.75 mL of octadecene: ODE were input. Then, the materials were dissolved with heat at 165° C. for 5 minutes while stirring under the inert gas ($N_2$) atmosphere.

To this solution, 1.14 mL of the Se-DDT/OLAm solution (0.7 M) was added and this mixture was heated at 165° C. for 30 minutes while stirring. The resulting reaction solution ($Cu_2Se$) was cooled to room temperature.

After that, to the $Cu_2Se$ reaction solution, 1844 mg of zinc acetate anhydride: $Zn(OAc)_2$, 10 mL of trioctylphosphine: TOP, and 0.4 mL of oleylamine: OLAm were added. Then, the mixture was heated at 180° C. for 45 minutes while stirring under the inert gas ($N_2$) atmosphere. The resulting reaction solution (ZnSe) was cooled to room temperature.

Ethanol was added to the reaction solution, which was cooled to room temperature, to generate a precipitate and through the centrifugal separation, the precipitate was collected. To this precipitate, 12 mL of octadecene: ODE was added and diffusion was performed.

After that, to 12 mL of the ZnSe-ODE solution, 1844 mg of zinc acetate anhydride: $Zn(OAc)_2$, 10 mL of trioctylphosphine: TOP, 1 mL of oleylamine: OLAm, and 6 mL of oleic acid: OLAc were added. Then, the mixture was heated at 280° C. for 20 minutes while stirring under the inert gas ($N_2$) atmosphere. The resulting reaction solution (ZnSe) was cooled to room temperature.

The obtained reaction solution was measured by the fluorescence spectrometer. As a result, an optical characteristic having a fluorescence wavelength of about 447.5 nm and a fluorescence half-width of about 14 nm was obtained.

Ethanol was added to 20 mL of the obtained ZnSe reaction solution to generate a precipitate and through the centrifugal separation, the precipitate was collected. To this precipitate, 17.5 mL of octadecene: ODE was added and diffusion was performed.

To 17.5 mL of the ZnSe-ODE solution after the diffusion, 1 mL of oleic acid: OLAc and 2 mL of trioctylphosphine: TOP were added. Then, the mixture was heated at 320° C. for 10 minutes while stirring under the inert gas ($N_2$) atmosphere.

To this solution, 0.5 mL of a mixed solution including 0.5 mL of the Se-TOP solution (1 M), 0.125 mL of DDT, 0.375 mL of trioctylphosphine: TOP, and 5 mL of the zinc oleate: $Zn(OLAc)_2$ solution (0.4 M) was added. Then, the mixture was heated at 320° C. for 10 minutes while stirring. This operation was repeated 4 times.

Ethanol was added to the obtained reaction solution to generate a precipitate and through the centrifugal separation, the precipitate was collected. To this precipitate, 17.5 mL of octadecene: ODE was added and diffusion was performed. As described above, 1 mL of oleic acid: OLAc and 2 mL of trioctylphosphine: TOP were added and the mixture was heated at 320° C. for 10 minutes while stirring under the inert gas ($N_2$) atmosphere.

To this solution, 0.5 mL of a mixed solution including 0.5 mL of DDT, 1.5 mL of trioctylphosphine: TOP, and 10 mL of the zinc oleate: $Zn(OLAc)_2$ solution (0.4 M) was added. Then, the mixture was heated at 320° C. for 10 minutes while stirring. This operation was repeated 10 times.

(A) After that, ethanol was added to the obtained reaction solution to generate a precipitate and through the centrifugal separation, the precipitate was collected. To this precipitate, 17.5 mL of octadecene: ODE was added and diffusion was performed. As described above, 1 mL of oleic acid: OLAc and 2 mL of trioctylphosphine: TOP were added and the mixture was heated at 320° C. for 10 minutes while stirring under the inert gas ($N_2$) atmosphere.

(B) To this solution, 0.5 mL of a mixed solution including 0.5 mL of DDT, 1.5 mL of trioctylphosphine: TOP, and 10 mL of the zinc oleate: $Zn(OLAc)_2$ solution (0.4 M) was added. Then, the mixture was heated at 320° C. for 10 minutes while stirring. This operation was repeated 6 times. After that, the mixture was heated at 320° C. for 30 minutes while stirring.

Subsequently, this reaction solution was subjected to an operation in accordance with the cleaning method and the covering method in (A) and (B) three times, so that the intended reaction solution (ZnSe/ZnS) was obtained finally. This reaction solution was cooled to room temperature.

The obtained reaction solution was measured by the fluorescence spectrometer. As a result, an optical characteristic having a fluorescence wavelength of about 444 nm and a fluorescence half-width of about 15 nm was obtained.

Ethanol was added to the obtained reaction solution to generate a precipitate and through the centrifugal separation, the precipitate was collected. To this precipitate, hexane was added and diffusion was performed.

ZnSe/ZnS diffused in hexane was measured by the quantum efficiency measurement system. As a result, the fluorescence quantum yield was about 62%. The result of measuring the fluorescence lifetime was 15 ns.

Example 7

In a 100-mL reaction vessel, 182 mg of copper acetate anhydride: $Cu(OAc)_2$, 4.8 mL of oleylamine: OLAm, and 7.75 mL of octadecene: ODE were input. Then, the materials were dissolved with heat at 165° C. for 5 minutes while stirring under the inert gas ($N_2$) atmosphere.

To this solution, 1.14 mL of the Se-DDT/OLAm solution (0.7 M) was added and the mixture was heated at 165° C. for 30 minutes while stirring. The obtained reaction solution ($Cu_2Se$) was cooled to room temperature.

After that, to the $Cu_2Se$ reaction solution, 1844 mL of zinc acetate anhydride: $Zn(OAc)_2$, 10 mL of trioctylphosphine: TOP, and 0.4 mL of oleylamine: OLAm were added. Then, the mixture was heated at 180° C. for 45 minutes while stirring under the inert gas ($N_2$) atmosphere. The resulting reaction solution (ZnSe) was cooled to room temperature.

Ethanol was added to the reaction solution, which was cooled to room temperature, to generate a precipitate and through the centrifugal separation, the precipitate was collected. To this precipitate, 12 mL of octadecene: ODE was added and diffusion was performed.

After that, to 12 mL of the ZnSe-ODE solution, 1844 mg of zinc acetate anhydride: $Zn(OAc)_2$, 10 mL of trioctylphosphine: TOP, 1 mL of oleylamine: OLAm, and 6 mL of oleic acid: OLAc were added. Then, the mixture was heated at 280° C. for 20 minutes while stirring under the inert gas ($N_2$) atmosphere. The resulting reaction solution (ZnSe) was cooled to room temperature.

The obtained reaction solution was measured by the fluorescence spectrometer. As a result, an optical characteristic having a fluorescence wavelength of about 447.5 nm and a fluorescence half-width of about 14 nm was obtained.

Ethanol was added to 20 mL of the obtained ZnSe reaction solution to generate a precipitate and through the centrifugal separation, the precipitate was collected. To this precipitate, 17.5 mL of octadecene: ODE was added and diffusion was performed.

To 17.5 mL of the ZnSe-ODE solution after the diffusion, 1 mL of oleic acid: OLAc and 2 mL of trioctylphosphine: TOP were added. Then, the mixture was heated at 320° C. for 10 minutes while stirring under the inert gas ($N_2$) atmosphere.

To this solution, 0.5 mL of a mixed solution including 0.5 mL of the Se-TOP solution (1 M), 0.125 mL of DDT, 0.375 mL of trioctylphosphine: TOP, and 5 mL of the zinc oleate: $Zn(OLAc)_2$ solution (0.4 M) was added. Then, the mixture was heated at 320° C. for 10 minutes while stirring. This operation was repeated 4 times.

After that, ethanol was added to the obtained reaction solution to generate a precipitate and through the centrifugal separation, the precipitate was collected. To this precipitate, 17.5 mL of octadecene: ODE was added and diffusion was performed. As described above, 1 mL of oleic acid: OLAc and 2 mL of trioctylphosphine: TOP were added and the mixture was heated at 320° C. for 10 minutes while stirring under the inert gas ($N_2$) atmosphere.

To this solution, 0.5 mL of a mixed solution including 0.5 mL of DDT, 1.5 mL of trioctylphosphine: TOP, and 10 mL of the zinc oleate: $Zn(OLAc)_2$ solution (0.4 M) was added. Then, the mixture was heated at 320° C. for 10 minutes while stirring. This operation was repeated 10 times.

(C) After that, ethanol was added to the obtained reaction solution to generate a precipitate and through the centrifugal separation, the precipitate was collected. To this precipitate, 17.5 mL of octadecene: ODE was added and diffusion was performed. As described above, 1 mL of oleic acid: OLAc and 2 mL of trioctylphosphine: TOP were added and the mixture was heated at 320° C. for 10 minutes while stirring under the inert gas ($N_2$) atmosphere.

(D) To this solution, 0.5 mL of a mixed solution including 0.5 mL of DDT, 1.5 mL of trioctylphosphine: TOP, and 10 mL of the zinc oleate: $Zn(OLAc)_2$ solution (0.4 M) was added. Then, the mixture was heated at 320° C. for 10 minutes while stirring. This operation was repeated 6 times. Then, the mixture was heated at 320° C. for 30 minutes while stirring.

After that, this reaction solution was subjected to the operation in accordance with the cleaning method and the covering method in (C) and (D) twice.

Subsequently, ethanol was added to the obtained reaction solution to generate a precipitate and through the centrifugal separation, the precipitate was collected. To this precipitate, 17.5 mL of octadecene: ODE was added and diffusion was performed. As described above, 1 mL of oleic acid: OLAc and 2 mL of trioctylphosphine: TOP were added and the mixture was heated at 320° C. for 10 minutes while stirring under the inert gas ($N_2$) atmosphere.

To this solution, 0.5 mL of a mixed solution including 0.5 mL of DDT, 1.5 mL of trioctylphosphine: TOP, and 10 mL of the zinc oleate: $Zn(OLAc)_2$ solution (0.4 M) was added. Then, the mixture was heated at 320° C. for 10 minutes while stirring. This operation was repeated 6 times. After that, the mixture was heated at 320° C. for 30 minutes while stirring.

(E) To this solution, 1.0 mL of a mixed solution including 0.25 mL of DDT, 0.75 mL of TOP, and 5 mL of an oleic acid/TOP solution of $ZnBr_2$ (0.4 M) was added. Then, the mixture was heated at 320° C. for 10 minutes. Finally, the intended reaction solution (ZnSe/ZnS) was obtained and cooled to room temperature.

The obtained reaction solution was measured by the fluorescence spectrometer. As a result, an optical characteristic having a fluorescence wavelength of about 444 nm and a fluorescence half-width of about 15 nm was obtained.

After that, ethanol was added to the obtained reaction solution to generate a precipitate and through the centrifugal separation, the precipitate was collected. To this precipitate, hexane was added and diffusion was performed.

ZnSe/ZnS diffused in hexane was measured by the quantum efficiency measurement system. As a result, the fluorescence quantum yield was about 76%. The result of measuring the fluorescence lifetime was 17 ns. The results of element analysis (EDX) were Zn: 53 atom %, Se: 16 atom %, S: 23 atom %, and Br: 1 atom %.

Example 8

The operation similar to that of Example 7 except that $ZnBr_2$ was changed to $ZnCl_2$ was performed, and ZnSe/ZnS was obtained with a fluorescence quantum yield of 80%.

Example 9

The operation similar to that of Example 7 except that $ZnBr_2$ was changed to $ZnI_2$ was performed, and ZnSe/ZnS was obtained with a fluorescence quantum yield of 69%.

In Examples 7 to 9, it has been found out that by covering the 445-nm ZnSe core with ZnS and then adding a solution containing zinc halide, the fluorescence quantum yield is improved by about 7% to 18% relative to Example 6 (see Table 2 below). The result of analyzing the composition after cleaning the QD obtained in Example 7 indicates that bromine (Br) is detected; thus, it is considered that the surface is modified with halogen and because of its effect, the fluorescence quantum efficiency is improved.

TABLE 2

| | Final additive | Fluorescence quantum yield (QY) |
|---|---|---|
| Example 6 | — | 62 |
| Example 7 | $ZnBr_2$ | 76 |
| Example 8 | $ZnCl_2$ | 80 |
| Example 9 | $ZnI_2$ | 69 |

Comparative Example 1

In a 100-mL reaction vessel, 0.833 mL of the $Zn(OLAc)_2$-ODE solution (0.4 M) and 10 mL of the Se-ODE solution (0.1 M) were input. Then, the mixture was heated at 280° C. for 35 minutes while stirring under the inert gas ($N_2$) atmosphere.

The obtained reaction solution was measured by the fluorescence spectrometer. As a result, an optical characteristic having a fluorescence wavelength of about 455.0 nm and a fluorescence half-width of about 45.2 nm was obtained.

Comparative Example 2

In a 300-mL reaction vessel, 182 mg of copper acetate anhydride: $Cu(OAc)_2$, 7.75 mL of oleylamine: OLAm, and 4.8 mL of octadecene: ODE were input. Then, the materials were dissolved with heat at 150° C. for 10 minutes while stirring under the inert gas ($N_2$) atmosphere.

To this solution, 2.8 mL of the Se-DDT/OLAm solution (0.285 M) was added and the mixture was heated at 150° C. for 30 minutes while stirring. The resulting reaction solution (CuSe) was cooled to room temperature.

After that, to the CuSe reaction solution, 0.682 g of zinc acetate anhydride: $Zn(OAc)_2$, 10 mL of trioctylphosphine: TOP, and 0.4 mL of oleylamine: OLAm were input. The mixture was heated at 180° C. for 30 minutes while stirring under the inert gas ($N_2$) atmosphere. The resulting reaction solution (ZnSe) was cooled to room temperature.

After that, ethanol was added to the reaction solution, which was cooled to room temperature, to generate a precipitate and through the centrifugal separation, the precipitate was collected. To this precipitate, 24 mL of octadecene: ODE was added and diffusion was performed.

After that, to 24 mL of the ZnSe-ODE solution, 0.682 g of zinc acetate anhydride: $Zn(OAc)_2$, 10 mL of trioctylphosphine: TOP, and 1 mL of oleylamine: OLAm were added. The mixture was heated at 180° C. for 30 minutes while stirring under the inert gas ($N_2$) atmosphere. The resulting reaction solution (ZnSe) was cooled to room temperature.

The obtained reaction solution was measured by the fluorescence spectrometer. As a result, an optical characteristic having a fluorescence wavelength of about 438.5 nm and a fluorescence half-width of about 13 nm was obtained.

The obtained reaction solution was measured by the quantum efficiency measurement system. As a result, the fluorescence quantum yield was about 11%. The result of measuring the fluorescence lifetime was 43 ns.

Ethanol was added to 20 mL of the aforementioned ZnSe reaction solution to generate a precipitate and through the centrifugal separation, the precipitate was collected. To this precipitate, 17.5 mL of octadecene: ODE was added and diffusion was performed.

Under the inert gas ($N_2$) atmosphere, 17.5 mL of the ZnSe-ODE solution after the diffusion was heated at 310° C. for 20 minutes while stirring.

To this solution, 0.545 mL of a mixed solution including 0.73 mL of the S-TOP solution (2.2 M) and 3.63 mL of the zinc oleate: $Zn(OLAc)_2$ solution (0.8 M) was added. The mixture was heated at 310° C. for 10 minutes while stirring. This operation was repeated 8 times. The obtained reaction solution (ZnSe/ZnS) was cooled to room temperature.

Ethanol was added to the obtained reaction solution to generate a precipitate and through the centrifugal separation, the precipitate was collected. To this precipitate, hexane was added and diffusion was performed.

Figure 4:
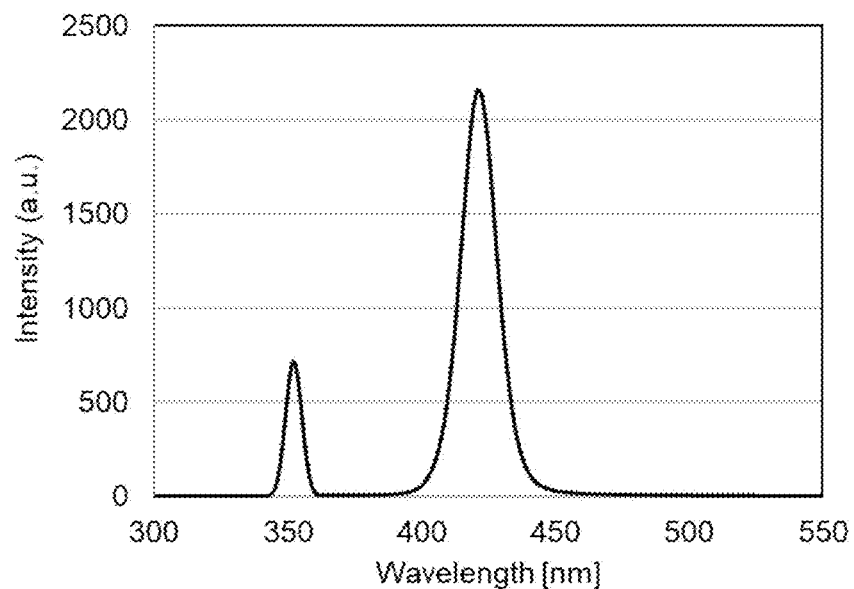
FIG. 4 expresses a photoluminescence (PL) spectrum of ZnSe/ZnS in Example 1.

ZnSe/ZnS diffused in hexane was measured by the quantum efficiency measurement system. As a result, as illustrated in FIG. 4, an optical characteristic having a fluorescence wavelength of about 437.5 nm and a fluorescence half-width of about 13.8 nm was obtained.

The similar solution was measured by the quantum efficiency measurement system. As a result, the fluorescence quantum yield was about 33%. The result of measuring the fluorescence lifetime was 44 ns.

The experiments to estimate the optimal number of times of adding the coverage in Example 1 were conducted on the basis of the number of times of adding the coverage and the change in fluorescence lifetime. The results are shown in Table 3 below.

TABLE 3

| | Wavelength (nm) | Fluorescence quantum yield (%) | Fluorescence lifetime (ns) | Particle diameter (nm) |
|---|---|---|---|---|
| Core | 428 | 28 | 13 | 5.3 |
| Covering: once | 429 | 22 | 11 | — |
| Covering: twice | 429 | 37 | 11 | — |
| Covering: three times | 429 | 46 | 10 | — |
| Covering: four times | 429 | 56 | 10 | 7.4 |
| Covering: six times | 428 | 61 | 10 | — |
| Covering: eight times | 425 | 61 | 11 | 10.1 |
| Covering: ten times | 423 | 55 | 12 | — |
| Covering: twelve times | 423 | 46 | 15 | 11.8 |

Thus, it is predicted that the optimal number of times of adding the coverage is 6 to 8 times at which the fluorescence quantum yield is high and the fluorescence lifetime is short. Although depending on the covering method, this tendency applies similarly to any material from the viewpoint of the particle diameter. Thus, the examples examine so that the coverage thickness (particle size) when the fluorescence quantum efficiency is the highest and the fluorescence lifetime is the shortest is maximized.

In Comparative example 1 and Comparative example 2 in the above experiments, S-TOP is used as a sulfur source at the covering with the shell (ZnS). This is effective for ZnSe in Example 1 where the particle diameter is small (fluorescence wavelength is short) but unsuitable for Comparative example 2 where ZnSe has a fluorescence wavelength of about 440 nm, and thus, it is understood that the particle shape becomes worse and the fluorescence quantum yield after the coverage also becomes low.

On the other hand, in Example 6, the sulfur source was changed to DDT. It is understood that, accordingly, when the fluorescence wavelength is 440 nm or more, the excellent fluorescence yield and particle shape can be maintained and covering with ZnS is possible. Table 4 below shows the summary of the above contents.

TABLE 4

| | Fluorescence wavelength of ZnSe core | Sulfur source of ZnS | Fluorescence quantum yield of ZnSe/ZnS | Particle shape |
|---|---|---|---|---|
| Example 1 | 424 nm | 2.2-M S-TOP | 60% | Rectangular |
| Example 6 | 445 nm | DDT | 62% | Rectangular |
| Comparative example 2 | 438 nm | 2.2-M S-TOP | 33% | Throwing star shape |

The above experiment results indicate that, in each example, the particle diameter of the quantum dot can be adjusted to be within the range of 5 nm or more and 20 nm or less. It is understood that the fluorescence quantum yield is 5% or more and the fluorescence half-width is 25 nm or less in each example. In addition, the fluorescence lifetime can be made 50 ns or less. Moreover, the fluorescence wavelength can be adjusted in the range of 410 nm or more and 490 nm or less. In addition, it is understood that in the core-shell structure including Zn, Se, and S, the maximum intensity peak position in XRD shifts to the 0.05° to 1.2° higher angle side than the crystal peak of the ZnSe core alone.

The peak shift to the higher angle side indicates that the lattice constant has changed by covering the ZnSe core with ZnS. Furthermore, it has been found out that this result indicates the peak shift quantity and the ZnS coverage quantity are in proportion. Moreover, although the position in XRD is very close to the peak position of ZnS in this result, it is considered that since the blue light (430 to 455 nm) is emitted, the core is ZnSe, which is covered with ZnS thereon.

That is to say, by the peak shift from the ZnSe core and the blue light emission, it can be presumed that the core-shell structure including Zn, Se, and S is obtained.

INDUSTRIAL APPLICABILITY

According to the present invention, the quantum dot that emits the blue fluorescence can be obtained stably. In addition, by using the quantum dot according to the present invention for the LED, the backlight device, the display device, or the like, such a device can have the excellent light-emitting characteristic.

This application is based upon Japanese Patent Application No. 2019-170996, filed on Sep. 20, 2019; and Japanese Patent Application No. 2020-024688, filed on Feb. 17, 2020, the entire contents of all of which are incorporated herein by reference.

The invention claimed is:

1. A quantum dot comprising a core-shell structure including a core and a shell,
   wherein the core includes Zn and Se,
   wherein the shell comprises ZnS,
   wherein the quantum dot does not include Cd,
   wherein a particle diameter is 5 nm or more and 20 nm or less, and wherein a fluorescence lifetime of the quantum dot is 30 ns or less.

2. The quantum dot according to claim 1, wherein a maximum intensity peak position in XRD is on a 0.05° to 1.2° higher angle side than a crystal peak of a ZnSe core alone.

3. The quantum dot according to claim 1, wherein a fluorescence wavelength is 410 nm or more and 490 nm or less.

4. The quantum dot according to claim 1, wherein the quantum dot has a surface covered with a ligand.

5. The quantum dot according to claim 4, wherein the ligand is at least one selected from aliphatic amine-based ligands, phosphine-based ligands, and aliphatic carboxylic acid-based ligands.

6. A quantum dot comprising a core-shell structure including a core and a shell,
wherein the core includes Zn and Se,
wherein the shell comprises ZnS,
wherein the quantum dot does not include Cd,
wherein a fluorescence quantum yield of the quantum dot is at least 60%,
wherein a fluorescence half-width of the quantum dot is 25 nm or less, and
wherein a fluorescence lifetime of the quantum dot is 30 ns or less.

* * * * *